(12) United States Patent
Takatoh et al.

(10) Patent No.: US 12,101,073 B2
(45) Date of Patent: Sep. 24, 2024

(54) METHOD FOR DETERMINING A CLEANLINESS OF A CLEANING MEMBER

(71) Applicant: EBARA CORPORATION, Tokyo (JP)

(72) Inventors: Chikako Takatoh, Tokyo (JP); Megumi Uno, Tokyo (JP); Masahito Abe, Tokyo (JP); Toshiya Kon, Tokyo (JP); Yumiko Nakamura, Tokyo (JP); Shohei Shima, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 344 days.

(21) Appl. No.: 17/323,700

(22) Filed: May 18, 2021

(65) Prior Publication Data
US 2021/0384881 A1 Dec. 9, 2021

(30) Foreign Application Priority Data

May 20, 2020 (JP) .................................. 2020-087789

(51) Int. Cl.
| | | |
|---|---|---|
| H03H 9/215 | (2006.01) | |
| B08B 1/12 | (2024.01) | |
| B08B 3/08 | (2006.01) | |
| H03H 3/02 | (2006.01) | |

(52) U.S. Cl.
CPC ................. *H03H 3/02* (2013.01); *B08B 1/12* (2024.01); *B08B 3/08* (2013.01); *H03H 9/215* (2013.01)

(58) Field of Classification Search
None
See application file for complete search history.

(56) References Cited

U.S. PATENT DOCUMENTS

| | | | | | |
|---|---|---|---|---|---|
| 3,928,063 | A | * | 12/1975 | King, Jr. ................... | B08B 7/02 29/25.35 |
| 5,315,793 | A | * | 5/1994 | Peterson ................... | B24C 7/00 451/89 |
| 5,706,840 | A | * | 1/1998 | Schneider ................ | G01G 3/13 134/113 |
| 6,880,402 | B1 | * | 4/2005 | Couet ................... | E21B 34/066 73/1.49 |
| 2006/0000191 | A1 | | 1/2006 | Inoue et al. | |
| 2006/0219260 | A1 | * | 10/2006 | Iwami ............... | H01L 21/67046 134/6 |

(Continued)

FOREIGN PATENT DOCUMENTS

| | | | |
|---|---|---|---|
| JP | H05-317783 A | 12/1993 | |
| JP | H06-005577 A | 1/1994 | |

(Continued)

*Primary Examiner* — Spencer E. Bell
*Assistant Examiner* — Omair Chaudhri
(74) *Attorney, Agent, or Firm* — BakerHostetler

(57) ABSTRACT

In a method for determining cleanliness of a cleaning member that contacts a substrate and with which scrub cleaning is performed, the method includes a first step of self-cleaning a cleaning member by releasing contaminants from the cleaning member into a cleaning liquid, and a second step of bringing a self-cleaning discharged liquid into contact with an electrode of a crystal oscillator, attaching the contaminants contained in the discharged liquid onto the electrode of the crystal oscillator, then measuring a frequency response of the crystal oscillator in which the contaminants are attached onto the electrode, and determining cleanliness of the cleaning member based on the measured frequency response.

8 Claims, 22 Drawing Sheets

(56) References Cited

U.S. PATENT DOCUMENTS

| | | | | |
|---|---|---|---|---|
| 2008/0289652 | A1* | 11/2008 | Hamada | H01L 21/67046 |
| | | | | 134/6 |
| 2010/0212702 | A1* | 8/2010 | Hamada | H01L 21/02068 |
| | | | | 134/115 R |
| 2014/0261537 | A1* | 9/2014 | Chang | B08B 1/50 |
| | | | | 134/201 |
| 2016/0243593 | A1* | 8/2016 | Tanaka | B08B 1/32 |
| 2017/0004984 | A1* | 1/2017 | Nagaike | G01N 29/036 |
| 2017/0250095 | A1* | 8/2017 | Kim | B08B 3/12 |
| 2019/0088509 | A1 | 3/2019 | Suemasa | |
| 2019/0099787 | A1* | 4/2019 | Huang | A46B 17/06 |
| 2019/0155178 | A1* | 5/2019 | Lin | G03F 7/70925 |
| 2022/0326184 | A1* | 10/2022 | Kamimura | G01N 29/036 |

FOREIGN PATENT DOCUMENTS

| | | | |
|---|---|---|---|
| JP | H10-109074 A | | 4/1998 |
| JP | H11-152367 A | | 6/1999 |
| JP | 2010021457 A | * | 1/2010 |
| JP | 2019-054177 A | | 4/2019 |

* cited by examiner

METHOD FOR DETERMINING A CLEANLINESS OF A CLEANING MEMBER

CROSS-REFERENCE TO RELATED APPLICATIONS

This application claims the benefit of Japanese Priority Patent Application JP 2020-087789 filed on May 20, 2020, the entire contents of which are incorporated herein by reference.

FIELD

The present disclosure relates to a method for determining cleanliness of a cleaning member, a method for determining adsorption characteristics of contaminants that contaminate the cleaning member, and a method for determining cleanliness of a substrate.

BACKGROUND AND SUMMARY

In the related art, a method for cleaning a surface of a substrate such as a semiconductor substrate includes a scrub cleaning method in which cleaning is performed by rubbing a cleaning member made of a brush, a sponge, or the like while supplying pure water to the surface of the substrate.

Generally, after the CMP process of holding the substrate against the polishing pad under controlled pressure, and rotating and polishing it with the CMP slurry including a polishing material and a chemical additive present on the substrate, a substrate cleaning process is performed in order to remove particles of contaminants (often smaller than 0.3 μm) composed of particles from polishing slurry, chemicals added to the slurry, and reaction by-products of the polishing slurry. Since contaminants have some chemical components in the cleaning solution which are chemically inert, etc., in the substrate cleaning process after the CMP process, in addition to the cleaning process using chemicals, a scrub cleaning process is performed that substantially removes residues and contaminants from the substrate surface using a cleaning member composed of a sponge material (PVA, and the like) with fine pores and configured to have extremely low self-dusting properties. In this type of scrub cleaning, the ability to remote the substrate is high, but on the other hand, cleaning is performed by bringing the cleaning member into direct contact with the substrate, so that there is a problem that the cleaning member itself is contaminated, and the cleaning power decreases due to long-term use.

In addition, when contamination of the cleaning member progresses, not only the power of cleaning the substrate is decreased, but also contaminants deposited on the cleaning member contaminate the substrate, so that there is also a problem that the cleaning effect does not appear.

To avoid these problems, in the related art, a method for supplying the cleaning liquid to the cleaning member and applying ultrasonic vibration to the cleaning liquid (JP 5-317783 A), a method for cleaning the substrate with a cleaning brush in a cleaning liquid subjected to ultrasonic vibration (JP 6-5577 A), a method for rubbing a cleaning member and a contact member in an actuated cleaning liquid (JP 10-109074 A) and the like have been proposed.

However, although these methods are effective in removing contaminants deposited on the relatively superficial part of the cleaning member, in the situation where a higher cleaning effect than before is required due to the progress of miniaturization of semiconductor substrates, it is considered that this is not a sufficient method in removing contaminants that have entered the inside of the cleaning member to achieve a higher degree of cleaning performance. For example, a method for discharging the cleaning liquid from the inside of the cleaning member to reduce the internal contamination of the cleaning member is conceivable, but even in this method, for example, there remains a problem in realizing the advanced cleaning treatment over the entire inside of the cleaning member depending on the distance from the cleaning liquid supply unit.

In addition, in the related art, quantitative measurement of these contaminants is performed by quantitatively evaluating the number of contaminants remaining on a substrate after a substrate cleaning process is performed with a cleaning member using a defect inspection device.

However, for example, when all the cleaned substrates are evaluated by the defect inspection device, the throughput cannot be improved, and when the inspection is performed by sampling the substrates every predetermined number of substrates, it is difficult to perform timely evaluation. In addition, in the evaluation method itself, not all contaminants released from the cleaning member remain on the substrate and are detected, and actually, the number of contaminants greater than the number of contaminants detected on the substrate is released from the cleaning member. Therefore, when a higher cleaning effect than before is required due to the progress of miniaturization it is considered that it cannot be said that the conventional method for calculating the degree of contamination of the cleaning member only from the data of the number of contaminants remaining on the substrate, and determining whether it can be used based on that is a method for determining and estimating cleanliness that can be used as a determination index in the future.

Further, when a cleaning member such as a new roll cleaning member or a pencil cleaning member, which is typically made of a polyvinyl acetal resin porous body, is attached to a substrate cleaning device and use thereof is started, it is not possible to use the new cleaning member as it is for cleaning the substrate so as to prevent problems with substrates such as wafers, so that it is necessary to perform a break-in process. Specifically, an example of the cleaning member includes a wet-type cleaning member that is packaged (stored) in a wet state and then shipped, and in this wet-type cleaning member, contamination by various substances such as organic substances, ionic substances, fine particles, and microorganisms has been a problem. In addition, it is necessary to reduce contamination substance of the substrate cleaning member even before product shipment of the cleaning member, and in order to improve the substrate cleaning performance in the substrate cleaning process (at the time of actual use), it is preferable to reduce contamination substance by evaluating contamination substance that cannot be detected by the conventional degree of contamination evaluation at the product shipment stage of the cleaning member. That is, there is a demand for a new method for evaluating the degree of contamination of a cleaning member, which can be applied to an improved break-in process and an improved pre-shipment inspection of a cleaning member.

The present inventors have conducted intensive studies in order to find an improved technique in a method for evaluating the degree of contamination of a cleaning member. As a result, the following findings have been obtained. The following findings are merely a trigger for making the present invention, and do not limit the present invention.

That is, as a method for evaluating the degree of contamination of a cleaning member, in the related art, even low sensitivity plays a sufficient role, and when the analysis sensitivity is too high, the method is not necessarily suitable as a method for evaluating the degree of contamination, considering a signal-to-noise ratio (SN ratio). However, with the miniaturization of semiconductor substrates, the required level of particle removal in substrate cleaning is required to be much higher than before, and the inventor's examination has revealed that contaminants are eluted in the liquid after cleaning even in a state determined to be "clean" according to the conventional analysis method for evaluating degree of contamination (a state in which it is determined that contaminants have been removed according to the conventional analysis method).

As used herein, "contaminants" correspond to particles generated in the course of a substrate fabrication process, including, but not limited to, chemical mechanical polishing, wet etching, plasma etching, asking, and combinations thereof. Also, the contaminants remaining on the substrate after chemical mechanical polishing (CMP process) may include chemicals (such as corrosion inhibitor compounds) present in the slurry, polishing slurry, reaction by-products, polishing pad particles, debris away from the cleaning member, and any other materials that are by-products of the CMP process. The "contaminants" may include, for example, complexing agents, surfactants, sulfonic acid-containing hydrocarbons, dispersants.

Therefore, it is desirable to provide a technique capable of more accurately determining cleanliness of the cleaning member. In addition, a technique capable of more appropriately and quantitatively evaluating adsorption characteristics of contaminants attaching to the cleaning member is desired. Further, there is a demand for a new method for evaluating the degree of contamination of a cleaning member, which can be applied to an improved break-in process and an improved pre-shipment inspection of a cleaning member. In addition, it is desirable to provide a technique capable of more appropriately and accurately determining cleanliness of the subs rate while suppressing a decrease in throughput during cleaning.

A method according to an aspect of the present disclosure is a method for determining cleanliness of a cleaning member that contacts a substrate and with which scrub cleaning is performed, and includes: a first step of self-cleaning a cleaning member by releasing contaminants from the cleaning member into a cleaning liquid; and a second step of bringing a self-cleaning discharged liquid into contact with an electrode of a crystal oscillator, attaching the contaminants contained in the discharged liquid onto the electrode of the crystal oscillator, then measuring a frequency response of the crystal oscillator in which the contaminants are attached to the electrode, and determining cleanliness of the cleaning member based on the measured frequency response.

DETAILED DESCRIPTION OF NON-LIMITING EXAMPLE EMBODIMENTS

Figure 1:
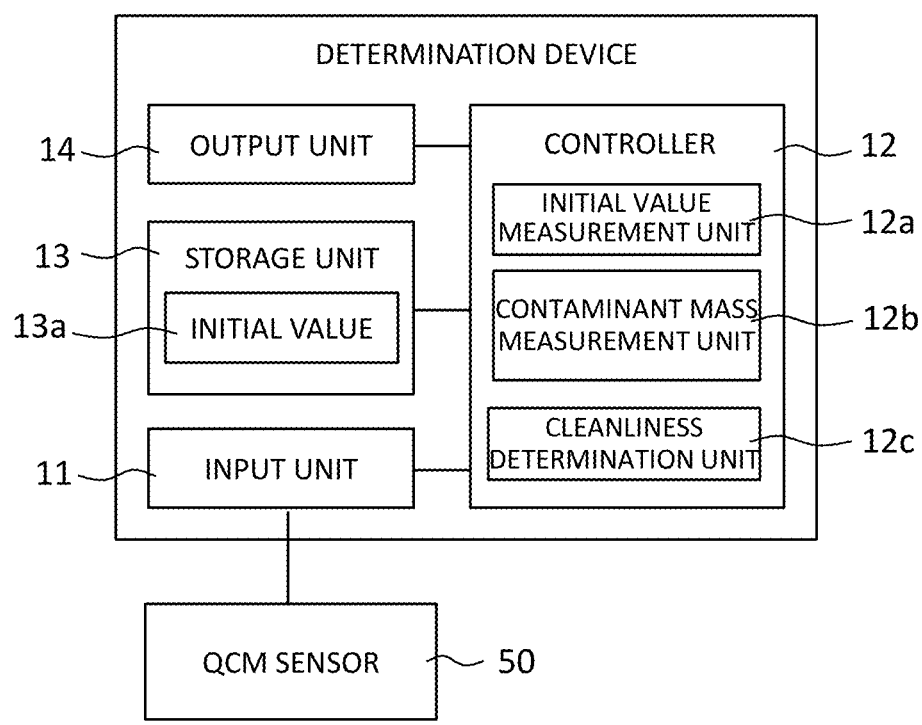
FIG. 1 is a block diagram illustrating a configuration of a determination device according to the first embodiment.

A method according to a first aspect of the present embodiment is a method for determining cleanliness of a cleaning member that contacts a substrate and with which scrub cleaning is performed, and includes a first step of self-cleaning a cleaning member by releasing contaminants from the cleaning member into a cleaning liquid, and a second step of bringing a self-cleaning discharged liquid into contact with an electrode of a crystal oscillator, attaching the contaminants contained in the discharged liquid onto the electrode of the crystal oscillator, then measuring a frequency response of the crystal oscillator in which the contaminants are attached to the electrode, and determining cleanliness of the cleaning member based on the measured frequency response.

According to such an aspect, after the discharged liquid in the self-cleaning of the cleaning member is brought into contact with the electrode of the crystal oscillator, and contaminants contained in the discharged liquid are attached onto the electrode of the crystal oscillator, the frequency response of the crystal oscillator in which the contaminants are attached to the electrode is measured, so that it is possible to detect even a very small mass of the contaminants, and cleanliness of the cleaning member is determined based on the measurement result, so that it is less likely that cleaning member with. the residual contaminants will be mistakenly determined to be "clean", that is, it is possible to accurately determine cleanliness of the cleaning member.

A method according to a second aspect of the present embodiment is the method according to the first aspect, wherein the first step includes self-cleaning the cleaning member by releasing contaminants from the cleaning member into a cleaning liquid in a housing where scrub cleaning is performed on the substrate, and the second step includes bringing a self-cleaning discharged liquid into contact with the electrode of the crystal oscillator in the housing, attaching the contaminants contained in the discharged liquid to the electrode of the crystal oscillator, then measuring a frequency response of the crystal oscillator in which the contaminants are attached onto the electrode with the crystal oscillator disposed in the housing, and determining cleanliness of the cleaning member based on the measured frequency response.

According to such an aspect, after bringing the self-cleaning discharged liquid into contact with the electrode of the crystal oscillator, and attaching contaminants contained in the discharged liquid onto the electrode of the crystal oscillator, the frequency response of the crystal oscillator in which the contaminants are attached to the electrode is measure while the crystal oscillator is disposed in the housing where scrub cleaning is performed on the substrate, so that it is possible to quickly determine cleanliness of the cleaning member in-line, and it is possible to check the change in cleanliness over time, and predict the deterioration and replacement time of the cleaning member based on the check.

A method according to a third aspect of the present embodiment is the method according to the first or second aspect, wherein the second step includes, before attaching a self-cleaning discharged liquid onto the electrode of the crystal oscillator and evaporating the discharged liquid attached onto the electrode, (a) measuring a frequency response of the crystal oscillator and measuring an amount of the discharged liquid attached onto the electrode based on the measured frequency response, or (b) measuring an amount of contact liquid with a measuring facility for a volume, a weight or a contact time of the discharged liquid, then, after evaporating the discharged liquid attached onto the electrode to deposit contaminants contained in the discharged liquid on the electrode of the crystal oscillator, measuring a frequency response of the crystal oscillator, measuring a mass of the contaminants deposited on the electrode based on the measured frequency response, calculating a contaminant concentration of the discharged liquid based on the measured amount of discharged liquid and the measured mass of the contaminants, and determining cleanliness of the cleaning member based on the calculated contaminant concentration.

A method according to a fourth aspect of the present embodiment is the method according to the first or second aspect, wherein the second step includes attaching a predetermined amount of self-cleaning discharged liquid onto the electrode of the crystal oscillator and evaporating the liquid to deposit contaminants contained in a discharged liquid on the electrode of the crystal oscillator, then measuring a frequency response of the crystal oscillator, measuring a mass of the contaminants deposited on the electrode based on the measured frequency response, and determining cleanliness of the cleaning member based on the measured mass of the contaminants.

A method according to a fifth aspect of the present embodiment is the method according to the first or second aspect, wherein the second step includes immersing, in a self-cleaning discharged liquid, a crystal oscillator in which an adsorption film that adsorbs contaminants by one or both actions of chemical adsorption and physical adsorption is fixed on an electrode, and adsorbing the contaminants contained in the discharged liquid onto the adsorption film, then measuring a frequency response of the crystal oscillator, measuring a mass of the contaminants adsorbed onto the adsorption film based on the measured frequency response, and determining cleanliness of the cleaning member based on the measured mass of the contaminants.

A method according to a sixth aspect of the present embodiment is the method according to the third or fourth aspect, and further includes a third step of immersing, in a liquid, the crystal oscillator in which contaminants are deposited on the electrode, measuring a temporal change in a frequency response of the crystal oscillator, and measuring a mass of liquid soluble contaminants based on a difference between a frequency when the temporal change levels off and a frequency response immediately after immersion in the liquid.

A method according to a seventh aspect of the present embodiments is the method according to the second aspect, and further includes a step of calculating a mass of liquid insoluble contaminants based on a difference between a mass of contaminants deposited on the electrode and a mass of liquid soluble contaminants.

A method according to an eighth aspect of the present embodiments is the method according to the sixth or seventh aspect, wherein the liquid is pure water, ammonia water, or an aqueous solution containing a cleaning liquid.

A method according to a ninth aspect of the present embodiments is the method according to any of the first to eighth aspects, wherein the first step includes immersing the cleaning member in the cleaning liquid to release contaminants from the cleaning member into the cleaning liquid.

A method according to a 10th aspect of the present embodiments is the method according to any of the first to eighth aspects, wherein the first step includes injecting a cleaning liquid toward a surface of a cleaning member to release contaminants from the cleaning member into the cleaning liquid.

A method according to an 11th aspect of the present embodiments is the method according to any of the first to eighth aspects, wherein the first step includes flowing a cleaning liquid into a cleaning member, and flowing out the cleaning liquid from a surface of the cleaning member to release contaminants from the cleaning member into the cleaning liquid.

A device according to a 12th aspect of the present embodiment is a device that determines cleanliness of a cleaning member that contacts a substrate and with which scrub cleaning is performed, and includes a measurement unit that measures a frequency response of a crystal oscillator in which contaminants are attached onto an electrode after the contaminants are released from the cleaning member into a cleaning liquid, the cleaning liquid containing the contaminants is brought into contact with the electrode of the crystal oscillator, and the contaminants contained in the cleaning liquid are attached onto the electrode of the crystal oscillator, and a determination unit that determines cleanliness of the cleaning member based on the measured frequency response.

A computer-readable storage medium according to a 13th aspect of the present embodiment non-transitorily stores the following control program: the program is a program for determining cleanliness of a cleaning member that contacts a substrate and with which scrub cleaning is performed, and causes a computer to execute, a step of measuring a frequency response of a crystal oscillator in which contaminants are attached onto an electrode after the contaminants are released from the cleaning member into a cleaning liquid, the cleaning liquid containing the contaminants is brought into contact with the electrode of the crystal oscillator, and the contaminants contained in the cleaning liquid are attached onto the electrode of the crystal oscillator, and a step of determining cleanliness of the cleaning member based on the measured frequency response.

A substrate cleaning device according to a 14th aspect of the present embodiment includes a cleaning member that is disposed in a housing and contacts a substrate and with which scrub cleaning is performed, a self-cleaning device that is disposed in the housing and that releases contaminants from the cleaning member into a cleaning liquid, a crystal oscillator disposed in the housing, and a determination device that measures a frequency response of the crystal oscillator in which the contaminants are attached onto an electrode after a discharged liquid of the self-cleaning device is brought into contact with the electrode of the crystal oscillator, the contaminants contained in the discharged liquid are at onto the electrode of the crystal oscillator, and determines cleanliness of the cleaning member based on the measured frequency response.

A method according to a 15th aspect of the present embodiment is a method for determining adsorption characteristics of contaminants that contaminates a cleaning member that contacts a substrate and with which scrub cleaning is performed, and includes a step of immersing a cleaning member in pure water and releasing the contaminants from the cleaning member into the pure water, and a step of immersing, in the pure water containing the contaminants, a first crystal oscillator with a first substance having a first zeta potential formed on an electrode, and a second crystal oscillator with a second substance having a second zeta potential different from the first zeta potential formed on the electrode, measuring a frequency response of the first crystal oscillator and a frequency response of the second crystal oscillator, and determining adsorption characteristics of the contaminants based on a difference in temporal change between the two frequency responses.

A method according to a 16th aspect of the present embodiment is a method for determining cleanliness of a substrate with which a cleaning member is brought into contact and on which scrub cleaning is performed, and includes a step of cleaning the substrate by bringing the cleaning member into contact with the substrate while supplying a chemical solution, and then washing the substrate with water, a step of sampling part of discharged water used for washing the substrate with water at first timing, supplying the sampled discharged water to the electrode of the crystal oscillator and then evaporating the sampled discharged water, and measuring a frequency response of the crystal oscillator as a first frequency measurement value, a step of sampling part of discharged water used for washing the substrate with water at second timing which is different from the first timing, supplying the sampled discharged water to the electrode of the crystal oscillator and then evaporating the sampled discharged water, and measuring a frequency response of the crystal oscillator as a second frequency measurement value, a step of determining cleanliness of the discharged water based on the first frequency measurement value and the second frequency measurement value, and a step of determining cleanliness of the substrate based on the cleanliness of the discharged water.

A method according to a 17th aspect of the present embodiment is the method according to the 16th aspect, wherein the measuring the frequency of the crystal oscillator includes sampling part of the discharged water used for washing the substrate with water from a branch. pipe branched from a discharged water pipe, supplying the sampled discharged liquid to the electrode of the crystal oscillator and then evaporating the sampled discharged liquid, and measuring a frequency of the crystal oscillator.

A device according to a 18th aspect of the present embodiment is a device that determines cleanliness of a substrate with which a cleaning member is brought into contact and on which scrub cleaning is performed, and includes, when cleaning the substrate by bringing the cleaning member into contact with the substrate while supplying a chemical solution, and then washing the substrate with water, a unit that measures, as a first frequency measurement value, a frequency response of the crystal oscillator in which contaminants contained in the discharged water are deposited on an electrode when part of discharged water used for washing the substrate with water at first timing is sampled, and the sampled discharged water is supplied to the electrode of the crystal oscillator and then evaporated, and that measures, as a second frequency measurement value, a frequency response of the crystal oscillator in which the contaminants contained in the discharged water are deposited on the electrode when part of discharged water used for washing the substrate at second timing which is different from the first timing is sampled, and the sampled discharged water is supplied to the electrode of the crystal oscillator and then evaporated, a unit that determines cleanliness of the discharged water based on the first frequency measurement value and the second frequency measurement value, and a unit that determines cleanliness of the substrate based on the cleanliness of the discharged water.

A computer-readable storage medium according to a 19th aspect of the present embodiment non-transitorily stores the following control program: the program is a program for determining cleanliness of a substrate when scrub cleaning is performed by bringing a cleaning member into contact with the substrate using a substrate cleaning device, and causes a computer to execute, when cleaning the substrate by bringing the cleaning member into contact with the substrate while supplying a chemical solution, and then washing the substrate with water, a step of measuring, as a first frequency measurement value, a frequency response of the crystal oscillator in which contaminants contained in the discharged water are deposited on an electrode when part of discharged water used for washing the substrate with water at first timing is sampled, and the sampled discharged water is supplied to the electrode of the crystal oscillator and then evaporated, a step of measuring, as a second frequency measurement value, a frequency response of the crystal oscillator in which the contaminants contained in the discharged water are deposited on the electrode when part of discharged water used for washing the substrate with water at second timing which is different from the first timing is sampled, and the sampled discharged water is supplied to the electrode of the crystal oscillator and then evaporated, a step of determining cleanliness of the discharged water based on the first frequency measurement value and the second frequency measurement value, and a step of determining cleanliness of the substrate based on the cleanliness of the discharged water.

A computer-readable storage medium according to a 20th aspect of the present embodiment non-transitorily stores the following control program: the program is a program for determining an end point of a cleaning process of a substrate cleaning device that continuously cleans a plurality of substrates, and causes a computer to execute, when a cleaning member is brought into contact with a first substrate while supplying a chemical solution to clean the first substrate, and then the first substrate is washed with water, a step of measuring, as a first frequency measurement value, a frequency response of the crystal oscillator in which contaminants contained in the discharged water are deposited on the electrode when part of discharged water used for washing the first substrate with water is sampled, and the sampled discharged water is supplied onto an electrode of a crystal oscillator and then evaporated, acquiring, from a defect inspection device, the number of defects on the first substrate evaluated by the defect inspection device after the first substrate washed with water is dried, and when the number of defects falls below a predetermined reference value, recording the first frequency measurement value as an end point of the cleaning process on acquiring, medium, when the member is brought into contact with a second substrate while supplying the chemical solution to clean the second substrate, and then the second substrate is washed with water, a step of measuring, as a second frequency measurement value, the frequency response of the crystal oscillator in which the contaminants contained in the discharged water are deposited on the electrode when part of the discharged water used for washing the second substrate with water is sampled, and the sampled discharged water is supplied to the electrode of the crystal oscillator and then evaporated, a step of comparing the recorded first frequency measurement value with the measured second frequency measurement value, and determining that an end point of the cleaning process is reached when the second frequency measurement value is greater than or equal to the first frequency measurement value, and determining that an end point of the cleaning process is not reached when the second frequency measurement value is less than the first frequency measurement value, and a step of transmitting, to the substrate cleaning device, a first control signal for stopping a cleaning process for the second substrate when it is determined that an end point is reached, and transmitting, to the substrate cleaning device, a second control signal for continuing a cleaning process for the second substrate when it is determined that an end point is not reached.

A method according to a 21st aspect of the present embodiment is a method for determining cleanliness of a cleaning member that contacts a substrate and with which scrub cleaning is performed, and includes a step of measuring a frequency of a crystal oscillator before depositing contaminants on the electrode and recording the frequency as the initial value on a recording medium, a step of immersing the cleaning member in pure water and releasing the contaminants from the cleaning member into pure water, a step of starting to stir pure water containing the contaminants, and then sampling the pure water containing the contaminants as a sample liquid, a step of dropping a predetermined amount of the sampled sample liquid onto the electrode of the crystal oscillator and evaporating the liquid to deposit the contaminants contained in the sample liquid on the electrode of the crystal oscillator, a step of measuring the frequency of the crystal oscillator in which the contaminants are deposited on the electrode, receiving a signal related to the measured frequency in the controller, calculating a difference between the measurement value and an initial value while referring the initial value by the controller, and measuring a mass of the contaminants deposited on the electrode based on the calculated difference, and a step of determining cleanliness of the cleaning member based on the mass of the contaminants deposited on the electrode.

According to such an aspect, since the mass of contaminants is measured based on the measurement of the frequency of the crystal oscillator, it is possible to detect even a very small mass of the contaminants, and cleanliness of the cleaning member is determined based on the measurement result, so that it is less likely that a cleaning member with the residual contaminants will be mistakenly determined to be "clean", that is, it is possible to accurately determine cleanliness of the cleaning member.

A method according to a 22nd aspect of the present embodiment is the method according to the 21st aspect, and further includes a step of immersing, in a liquid, the crystal oscillator in which contaminants are deposited on the electrode, measuring a temporal change in a frequency of the crystal oscillator, and measuring a mass of liquid soluble contaminants based on a difference between a frequency when the temporal change levels off and a frequency immediately after immersion in the liquid.

According to such an aspect, it is possible to determine whether contaminants of the cleaning member contain a liquid-soluble substance, and the chemical properties (liquid solubility) of the contaminants can be classified and measured.

A method according to a 23rd aspect of the present embodiments is the method according to the 22nd aspect, and further includes a step of calculating a mass of liquid insoluble contaminants based on a difference between a mass of contaminants deposited on the electrode and a mass of liquid soluble contaminants.

According to such an aspect, it is possible to determine whether contaminants of the cleaning member contain a liquid-insoluble substance, and the chemical properties (liquid-insolubility) of the contaminants can be classified and measured.

A method according to a 24th aspect of the present embodiments is the method according to the 22nd or 23rd aspect, wherein the liquid is pure water.

According to such an aspect, it is possible to determine whether the contaminants of the cleaning member contain a water-soluble substance (or a water-insoluble substance).

A method according to a 25th aspect of the present embodiment is a method for determining adsorption characteristics of contaminants that contaminates a cleaning member that contacts a substrate and with which scrub cleaning is performed, and includes a step of immersing a cleaning member is pure water and releasing the contaminants from the cleaning member into the pure water, and a step of immersing, in pure water containing the contaminants, a first crystal oscillator with a first substance having a first zeta potential formed on an electrode, and a second crystal oscillator with a second substance having a second zeta potential different from the first zeta potential formed on the electrode, measuring a frequency of the first crystal oscillator and a frequency of the second crystal oscillator, and determining adsorption characteristics of the contaminants based on a difference in temporal change between the two frequencies.

According to such an aspect since the adsorption characteristics of contaminants is determined based on the measurement of the frequency of the first crystal oscillator and the frequency of the second crystal oscillator, it is possible to determine the adsorption characteristics of even a very small mass of the contaminants, that is, it is possible to quantitatively evaluate the adsorption characteristics of the contaminants that contaminate the cleaning member.

A device according to a 26th aspect of the present embodiment is a device that determines cleanliness of a cleaning member that contacts a substrate and with which scrub cleaning is performed, and includes a unit that measures a frequency of the crystal oscillator before depositing contaminants on the electrode and records the frequency as an initial value on a recording medium, a unit that measures the frequency of the crystal oscillator in which the contaminants contained in the sample liquid are deposited on the electrode when the cleaning member is immersed in pure water, the contaminants are released into pure water from the cleaning member, stirring of pure water containing the contaminants is started, then the pure water containing the contaminants is sampled as a sample liquid, and a predetermined amount of the sampled sample liquid is dropped onto the electrode of the crystal oscillator and evaporated, calculates the difference between the measurement value and an initial value with reference to the initial value, and measures the mass of the contaminants deposited on the electrode based on the calculated difference, and a unit that determines cleanliness of cleaning member based on the mass of the contaminants deposited on the electrode.

A computer-readable storage medium according to a 27th aspect of the present embodiment non-transitorily stores the following control program: the program is a program that determines cleanliness of a cleaning member that contacts a substrate and with which scrub cleaning is performed, and causes a computer to execute a step of measuring a frequency of the crystal oscillator before depositing contaminants on the electrode and recording the frequency as an initial value on a recording medium, a step of measuring the frequency of the crystal oscillator in which the contaminants contained in the sample liquid are deposited on the electrode when the cleaning member is immersed in pure water, the contaminants are released into pure water from the cleaning member, stirring of pure water containing the contaminants is started, then the pure water containing the contaminants is sampled as a sample liquid, and a predetermined amount of the sampled sample liquid is dropped onto the electrode of the crystal oscillator and evaporated, calculating the difference between the measurement value and an initial value with reference to the initial value, and measuring the mass of the contaminants deposited on the electrode based on the calculated difference, and a step of determining cleanliness of cleaning member based on the mass of the contaminants deposited on the electrode.

A method according to a 28th aspect of the present embodiment is a method for determining cleanliness of a substrate with which a cleaning member is brought into contact and on which scrub cleaning is performed, and includes a step of cleaning the substrate by bringing the cleaning member into contact with the substrate while supplying a chemical solution, and then washing the substrate with water, a step of sampling part of discharged water used for washing the substrate with water at first timing, supplying the sampled discharged water to the electrode of the crystal oscillator and then evaporating the sampled discharged water, and measuring a frequency of the crystal oscillator as a first frequency measurement value, a step of sampling part of discharged water used for washing the substrate with water at second timing which is different from the first timing, supplying the sampled discharged water to the electrode of the crystal oscillator and then evaporating the sampled discharged water, and measuring a frequency of the crystal oscillator as a second frequency measurement value, a step of determining cleanliness of the discharged water based on the first frequency measurement value and the second frequency measurement value, and a step of determining cleanliness of the substrate based on the cleanliness of the discharged water.

According to such an aspect, since the mass of contaminants is measured based on the measurement of the frequency of the crystal oscillator, it is possible to detect even a very small mass of the contaminants, and cleanliness of the discharged water is determined based on the measurement result and cleanliness of the substrate is determined based on the determination result, so that it is less likely that the substrate with the residual contaminants will be mistakenly determined to be "clean", that is, it is possible to accurately determine cleanliness of the substrate.

A method according to a 29th aspect of the present embodiment is the method according to the eighth aspect, wherein the measuring the frequency of the crystal oscillator includes sampling part of the discharged water used for washing the substrate with water from a branch pipe branched from a discharged water pipe, supplying the sampled discharged liquid to the electrode of the crystal oscillator and then evaporating the sampled discharged liquid, and measuring a frequency of the crystal oscillator.

A device according to a 30th aspect of the present embodiment is a device that determines cleanliness of a substrate with which a cleaning member is brought into contact and on which scrub cleaning is performed, and includes, when cleaning the substrate by bringing the cleaning member into contact with the substrate while supplying a chemical solution, and then washing the substrate with water, a unit that measures, as a first frequency measurement value, a frequency or the crystal oscillator in which contaminants contained in the discharged water are deposited on an electrode when part of discharged water used for washing the substrate with water at first timing is sampled, and the sampled discharged water is supplied to the electrode of the crystal oscillator and then evaporated, and that measures, as a second frequency measurement value, a frequency of the crystal oscillator in which the contaminants contained in the discharged water are deposited on the electrode when part of discharged water used for washing the substrate at second timing which is different from the first timing is sampled, and the sampled discharged water is supplied to the electrode of the crystal oscillator and then evaporated, a unit that determines cleanliness of the discharged water based on the first frequency measurement value and the second frequency measurement value, and a unit that determines cleanliness of the substrate based on the cleanliness of the discharged water.

A computer-readable storage medium according to a 31st aspect of the present embodiment non-transitorily stores the following control program: the program is a program for determining cleanliness of a substrate when scrub cleaning is performed by bringing a cleaning member into contact with the substrate using a substrate cleaning device, and causes a computer to execute, when cleaning the substrate by bringing the cleaning member into contact with the substrate while supplying a chemical solution, and then washing the substrate with water, a step of measuring, as a first frequency measurement value, a frequency of the crystal oscillator in which contaminants contained in the discharged water are deposited on an electrode when part of discharged water used for washing the substrate with water at first timing is sampled, and the sampled discharged water is supplied to the electrode of the crystal oscillator and then evaporated, a step of measuring, as a second frequency measurement value, a frequency of the crystal oscillator in which the contaminants contained in the discharged water are deposited on the electrode when part of discharged water used for washing the substrate with water at second timing which is different from the first timing is sampled, and the sampled discharged water is supplied to the electrode of the crystal oscillator and then evaporated, a step of determining cleanliness of the discharged water based on the first frequency measurement value and the second frequency measurement value, and a step of determining cleanliness of the substrate based on the cleanliness of the discharged water.

A computer-readable storage medium. according to a 32nd aspect of the present embodiment non-transitorily stores the following control program: the program is a program for determining an end point of a cleaning process of a substrate cleaning device that continuously cleans a plurality of substrates, and causes a computer to execute, when a cleaning member is brought into contact with a first substrate while supplying a chemical solution to clean the first substrate, and then the first substrate is washed with water, a step of measuring, as a first frequency measurement value, a frequency of the crystal oscillator in which contaminants contained in the discharged water are deposited on the electrode when part of discharged water used for washing the first substrate with water is sampled, and the sampled discharged water is supplied onto an electrode of a crystal oscillator and then evaporated, acquiring, from a defect inspection device, the number of defects on the first substrate evaluated by the defect inspection device after the first substrate washed with water is dried, and when the number of defects falls below a predetermined reference value, recording the first frequency measurement value as an end point of the cleaning process on a recording medium, when the cleaning member is brought into contact with a second substrate while supplying the chemical solution to clean the second substrate, and then the second substrate is washed with water, a step of measuring, as a second frequency measurement value, the frequency of the crystal oscillator in which the contaminants contained in the discharged water are deposited on the electrode when part of the discharged water used for washing the second substrate with water is sampled, and the sampled discharged water is supplied to the electrode of the crystal oscillator and then evaporated, a step of comparing the recorded first frequency measurement value with the measured second frequency measurement value, and determining that an end point of the cleaning process is reached when the second frequency measurement value is greater than or equal to the first frequency measurement value, and determining that an end point of the cleaning process is not reached when the second frequency measurement value is less than the first frequency measurement value, and a step of transmitting, to the substrate cleaning device, a first control signal for stopping a cleaning process and starting a drying process for the second substrate when it is determined that an end point is reached, and transmitting, to the substrate cleaning device, a second control signal for continuing a cleaning process for the second substrate when it is determined that an end point is not reached.

Hereinafter, specific examples of embodiments will be described in detail with reference to the accompanying drawings. In the following description and the drawings used in the following description, the same reference numerals are used for parts that can be constituted in the same manner, and redundant explanations are omitted.

First Embodiment

FIG. 1 is a block diagram illustrating a configuration of a determination device 10 according to the first embodiment. The determination device 10 according to the first embodiment is a device that determines cleanliness of a cleaning member that contacts a substrate and with which scrub cleaning is performed. The determination device 10 includes one or a plurality of computers.

As illustrated in FIG. 1, the determination device 10 has an input unit 11, a controller 12, a storage unit and an output unit 14. The respective units are communicably connected to each other via a bus.

Among these, the input unit 11 is a communication interface between a quartz crystal microbalance (QCM) sensor 50 and the determination device 10. The input unit 11 receives data of the frequency of the crystal oscillator output from the QCM sensor 50.

The output unit 14 is an interface that outputs various types of information from the determination device 10 to the user, and is, for example, a video display unit such as a liquid crystal display or an audio output unit such as a speaker. A determination result by a cleanliness determination unit 12c described later is output to the user via the output unit 14.

The storage unit 13 is, for example, a nonvolatile data storage such as a flash memory. The storage unit 13 stores various pieces of data handled by the controller 12. In addition, an initial value 13a of the frequency of the crystal oscillator measured by an initial value measurement unit 12a described later is recorded in the storage unit 13.

The controller 12 is a control unit that performs various processes of the determination device 10. As illustrated in FIG. 1, the controller 12 has the initial value measurement unit 12a, a contaminant mass measurement unit 12b, and the cleanliness determination unit 12c. These units may be implemented by a processor in the determination device 10 executing a predetermined program, or may be implemented by hardware.

The initial value measurement unit 12a measures the frequency of the crystal oscillator of the QCM sensor 50 before the contaminants are deposited on the electrode, and records the measured frequency, as the initial value 13a in the storage unit 13 (recording medium).

When the cleaning member is immersed in pure water, contaminants are released into pure water from the cleaning member, stirring of pure water containing contaminants is started, then the pure water containing contaminants is sampled as a sample liquid, and a predetermined amount of the sampled sample liquid is dropped onto the electrode of the crystal oscillator of the QCM sensor 50 and evaporated, the contaminant mass measurement unit 12b measures the frequency of the crystal oscillator which the contaminants contained in the sample liquid are deposited on the electrode. Then, the contaminant mass measurement unit 12b calculates a difference between the measurement value and the initial value 13a with reference to the initial value 13a, and measures the mass of contaminants deposited on the electrode based on the calculated difference.

The cleanliness determination unit 12c determines cleanliness of the cleaning member based on the mass of contaminants deposited on the electrode measured by the contaminant mass measurement unit 12b. For example, the cleanliness determination unit 12c compares the mass of contaminants deposited on the electrode with a predetermined threshold value, and when the mass of contaminants deposited on the electrode is equal to or less than the threshold value, the cleanliness determination unit 12c determines that the cleaning member is "clean", and when the mass of contaminants deposited on the electrode is larger than the threshold value, the cleanliness determination unit 12c determines that the cleaning member is "contaminated" (contaminants remain on the cleaning member).

In a state in which the crystal oscillator of the QCM sensor 50 in which contaminants are deposited on the electrode is immersed in a liquid (for example, pure water), the contaminant mass measurement unit 12b may measure the temporal change in the frequency of the crystal oscillator, and may measure the mass of liquid soluble contaminants based on the difference between the frequency when the temporal change levels off and the frequency immediately after immersion in the liquid.

The contaminant mass measurement unit 12b may calculate the mass of liquid insoluble contaminants based on the difference between the mass of contaminants deposited on the electrode and the mass of liquid soluble contaminants.

Figure 2A:
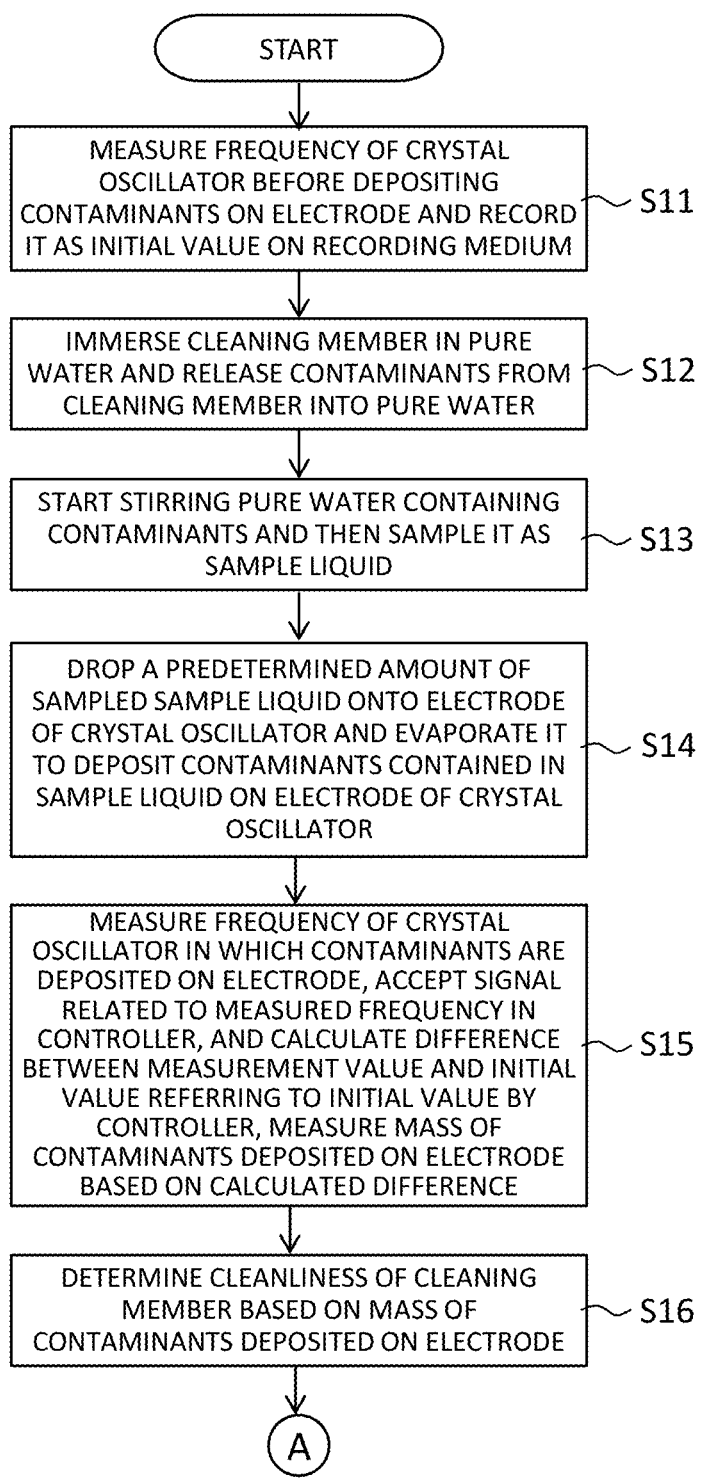
FIG. 2A is a flowchart illustrating a determination method according to the first embodiment.
Figure 2B:
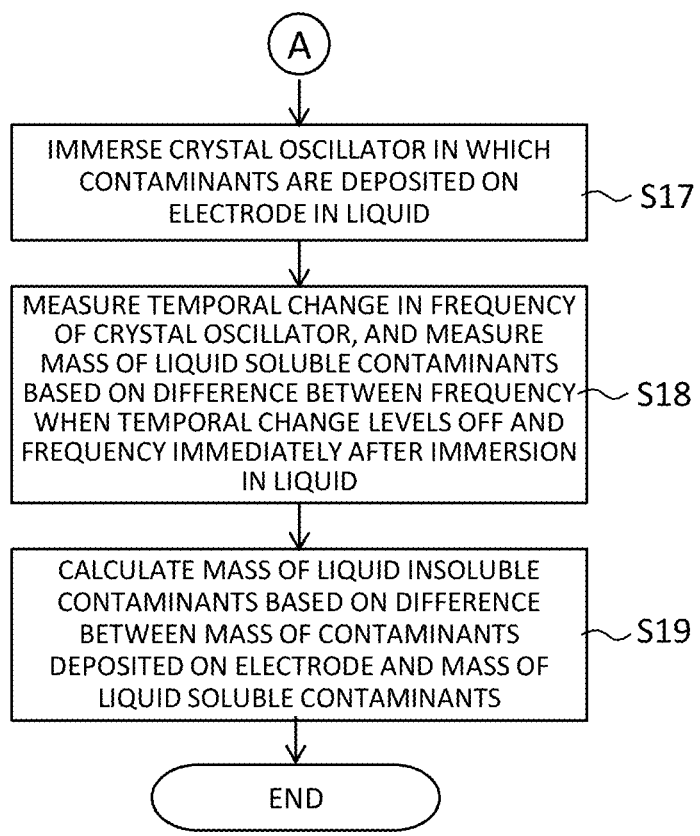
FIG. 2B is a flowchart illustrating the determination method according to the first embodiment.

Next, a determination method according to the first embodiment will be described. FIGS. 2A and 2B are flowcharts illustrating the determination method according to the first embodiment.

As shown in FIG. 2A, first, the initial value measurement unit 12a measures the frequency of the crystal oscillator of the QCM sensor 50 before the contaminants are deposited on the electrode, and records the measured frequency as the initial value 13a in the storage unit 13 (recording medium) (step S11).

Next, the user immerses the cleaning member in pure water to release contaminants from the cleaning member into the pure water (step S13). At this time, an ultrasonic wave may be applied to the pure water to vibrate the pure water, or the cleaning member may be washed by rubbing.

Next, after starting stirring of pure water containing contaminants, the user samples the pure water as a sample liquid in a uniform state using a pipette or the like (step S13).

Next, the user drops a predetermined amount (for example, several microliters) of the sampled sample liquid onto the electrode of the crystal oscillator of the QCM sensor 50 and evaporates it to deposit contaminants contained in the sample liquid on the electrode of the crystal oscillator (step S14).

Next, the contaminant mass measurement unit 12b measures the frequency of the crystal oscillator of the QCM sensor 50 in which contaminants are deposited on the electrode, accepts a signal related to the measured frequency, calculates the difference between the measurement value and the initial value 13a with reference to the initial value 13a, and measures the mass of contaminants deposited on the electrode based on the calculated difference (step S15).

More specifically, in the QCM sensor 50, electrodes are provided on the front and rear surfaces of the crystal oscillator, and the crystal oscillator vibrates by applying a voltage to the electrodes. The frequency of the crystal oscillator varies depending on the mass of the electrode. In the case of the present embodiment, the frequency of the crystal oscillator decreases after the contaminants are deposited on the electrode. Assuming that the initial value 13a is A0 and the measurement value in a state where the contaminants are deposited on the electrode is A1, the absolute value of a numerical value (A0−A1)×B obtained by multiplying the difference A0−A1 between the measurement value A1 and the initial value A0 by the ratio B of the mass/frequency inherent to this crystal oscillator is the Mass of contaminants (mass of contaminants).

Next, the cleanliness determination unit 12c determines cleanliness of the cleaning member based on the mass of contaminants deposited on the electrode (step S16). For example, the cleanliness determination unit 12c compares the mass of contaminants deposited on the electrode with a predetermined threshold value, and when the mass of contaminants deposited on the electrode is equal to or less than the threshold value, the cleanliness determination unit 12c determines that the cleaning member is "clean", and when the mass of contaminants deposited on the electrode is larger than the threshold value, the cleanliness determination unit 12c determines that the cleaning member is "contaminated" (contaminants remain on the cleaning member). The determination result by the cleanliness determination unit 12c is output to the user via the output unit 14.

Next, the user immerses the crystal oscillator of the QCM sensor 50 in which contaminants are deposited on the electrode in a liquid (for example, pure water) (step S17).

Then, the contaminant mass measurement unit 12b measures the temporal change in the frequency of the crystal oscillator immersed in the liquid, and measures the mass of liquid soluble contaminants based on the difference between the frequency when the temporal change levels off and the frequency immediately after immersion in the liquid (step S18).

In addition, the contaminant mass measurement unit 12b calculates the mass of liquid insoluble contaminants based on the difference between the mass of contaminants deposited on the electrode and the mass of liquid soluble contaminants (step S19).

Figure 3:
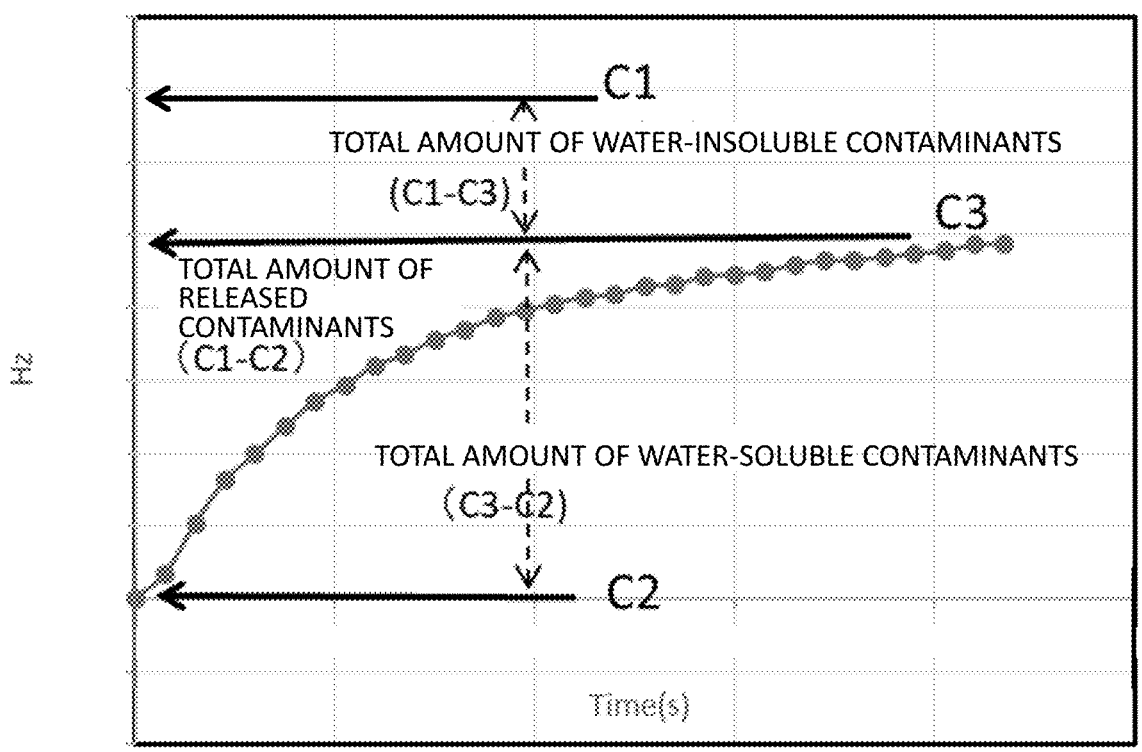
FIG. 3 is a graph illustrating a temporal change in the frequency of the crystal oscillator immersed in the liquid in the first embodiment.

Next, an example according to the first embodiment will be described with reference to FIG. 3. FIG. 3 is a graph illustrating a temporal change in the frequency of the crystal oscillator immersed in the liquid. In this example, pure water is used as a liquid, and the presence or absence of water solubility of contaminants released from a polyvinyl formal brush, which is often used as a cleaning member, is quantitatively measured.

In the graph of FIG. 3, C1 indicates the frequency measured when the initial crystal oscillator before the contaminants are deposited on the electrode is immersed in the liquid. C2 indicates the frequency immediately after the crystal oscillator in which contaminants are deposited on the electrode is immersed in pure water. (C1−C2)×B is the mass of contaminants.

As illustrated in FIG. 3, the frequency of the crystal oscillator in which contaminants are deposited on the electrode gradually increased with the lapse of time from immediately after the crystal oscillator is immersed in pure water, and gradually levels off. C3 represents the frequency that levels off.

This change in the frequency represents a phenomenon in which contaminants are dissolved in pure water. That is, it is indicated that a water-soluble component is contained in the contaminants, and the mass thereof is (C2−C3)×B.

In the present example, a polyvinyl formal brush is used as the cleaning member, and polyvinyl alcohol as a raw material thereof is water-soluble, so that it can be presumed that polyvinyl alcohol is contained in the contaminants of the cleaning member as water-soluble contaminants.

On the other hand, it can be seen from the graph of FIG. 3 that the mass of water-insoluble contaminants is (C1−C3)×B. From this, it has been found that the contaminants attached to the cleaning member are not composed of one kind but composed of different substances, and further, it has been found that water-soluble substances are included in the contaminants.

Although the pure water is used as a liquid in the present example, the present invention is not limited thereto, and it is possible to more finely classify the chemical properties of the contaminants of the cleaning member by using another solvent as the liquid.

According to the present embodiment as described above, since the mass of contaminants is measured based on the measurement of the frequency of the crystal oscillator, at is possible to detect even a very small mass of the contaminants, and cleanliness of the cleaning member is determined based on the measurement result, so that it is less likely that a cleaning member with the residual contaminants will be mistakenly determined to be "clean", that is, it is possible to accurately determine cleanliness of the cleaning member.

Further, according to the present embodiment, the crystal oscillator in which contaminants are deposited on the electrode is immersed in a liquid and the mass of liquid soluble contaminants is measured based on the temporal change in the frequency of the crystal oscillator, so that it is possible to determine whether the contaminants of the cleaning member contain liquid-soluble substances, and the chemical properties (liquid-solubility) of the contaminants can be classified and measured.

Further, according to the present embodiment, the mass of liquid insoluble contaminants is calculated based on the difference between the mass of contaminants deposited on the electrode and the mass of liquid soluble contaminants, so that it is possible to determine whether the contaminants of the cleaning member contain liquid-insoluble substances, and the chemical properties (liquid-insolubility) of the contaminants can be classified and measured.

Second Embodiment

Next, the second embodiment will be described. A determination method according to the second embodiment is a method for determining adsorption characteristics of contaminants contaminating a cleaning member that contacts a substrate and with which scrub cleaning is performed.

When adsorptivity of the contaminants to the substrate with which the cleaning member is brought into contact is large, it is conceivable that the contaminants released from the cleaning member back-contaminate the substrate. Therefore, it is important to grasp the adsorption characteristics of contaminants to the substrate. As a parameter indicating this adsorption characteristics, a measurement value called zeta potential is often used. It is determined that substances having the same sign of zeta potential are difficult to adsorb, but substances having opposite signs of zeta potential are easy to adsorb. The characteristics of the zeta potential is generally pH dependent, and data of the pH dependence of the zeta potential of various substances is disclosed.

Therefore, in the present embodiment, a thin film of a substance whose zeta potential is known is formed on the Au electrode of the crystal oscillator of the QCM sensor. It is desirable to prepare two or more different crystal oscillators in which two or more substances having different zeta potentials are formed on electrode. In addition, it is more desirable to prepare a substance, identical to that of the substrate to be cleaned, which is formed on the electrode of the crystal oscillator. By forming a thin film of another substance on the Au electrode of the crystal oscillator, it is possible to determine the adsorption characteristics of the contaminants as described below.

Figure 4:
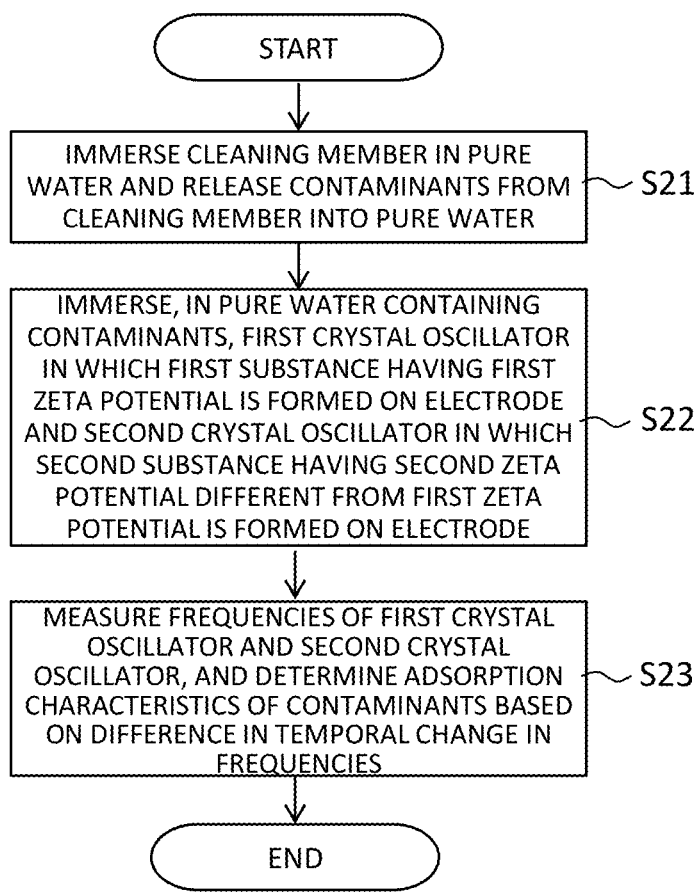
FIG. 4 is a flowchart illustrating a determination method according to the second. embodiment.

FIG. 4 is a flowchart illustrating a determination method according to the second embodiment.

Figure 5:
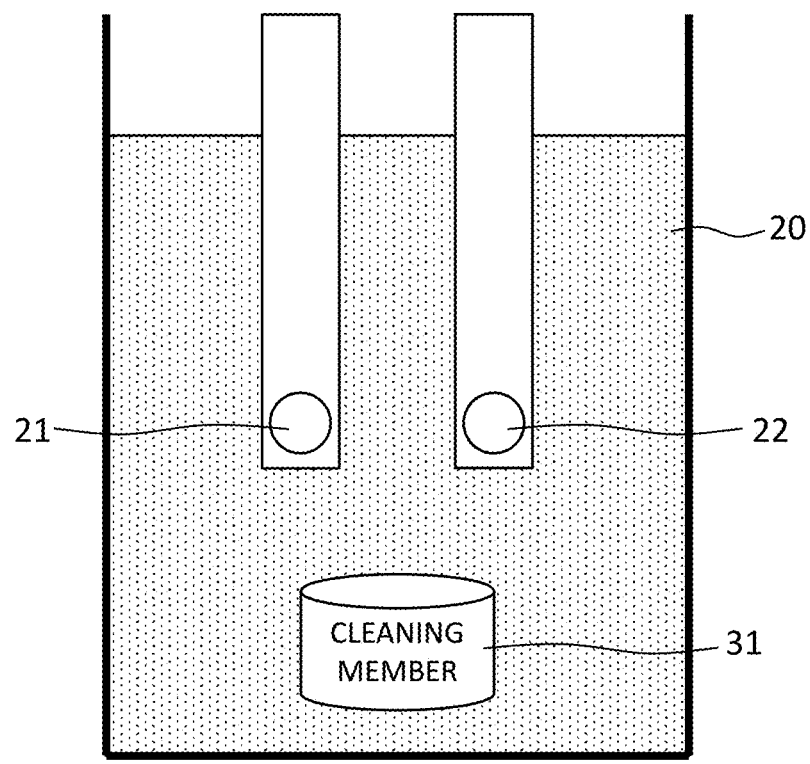
FIG. 5 is a diagram for explaining a step of immersing crystal oscillators having different zeta potentials in pure water including contaminants in the second embodiment.

In the determination method according to the second embodiment, first, as shown in FIG. 5, a cleaning member 31 is immersed in pure water 20, and contaminants are released from the cleaning member 31 into the pure water (step S21). At this time, the pure water 20 may be vibrated by applying ultrasonic waves, or the cleaning member 31 may be washed by rubbing.

Next, as illustrated in FIG. 5, a first crystal oscillator 21 in which a first substance having a first zeta potential is formed on an electrode and a second crystal oscillator 22 in which a second substance having a second zeta potential different from the first zeta potential is formed on an electrode are immersed in pure waiter 20 containing contaminants (step S22). Although not illustrated, a third crystal oscillator in which the substance identical to that of the substrate to be cleaned is formed on an electrode may be further immersed in the pure water 20.

The contaminants contained in the pure water 20 approach the electrode of the crystal oscillators 21 and 22 immersed in the pure water 20. At this time, when the sign of the zeta potential of the contaminants is opposite to that of the substance formed on the electrode of the crystal oscillators 21 and 22, a strong electrostatic attractive force acts on each other, the contaminants are adsorbed onto the electrode, and the frequencies of the crystal oscillators 21 and 22 change. On the other hand, when the contaminants and the substances formed on the electrode of the crystal oscillators 21 and 22 exhibit the identical zeta potential characteristic, the electrostatic repulsive force acts, the contaminants are not adsorbed onto the electrode, and the frequencies of the crystal oscillators 21 and 22 do not change.

Therefore, the frequency of each of the first crystal oscillator 21 and the second crystal oscillator 22 is measured, and the adsorption characteristics of the contaminants is determined based on the difference in the temporal change between the two frequencies (step S23). As a result, it is possible to qualitatively estimate not only the adsorption characteristics and the adsorption amount of the contaminants released from the cleaning member to the substrate to be cleaned but also the zeta potential characteristics of the contaminant.

According to the present embodiment as described above, since the adsorption characteristics of contaminants is determined based on the measurement of the frequency of the first crystal oscillator 21 and the frequency of the second crystal oscillator 22, it is possible to determine the adsorption characteristics of even a very small mass of contaminants, that is, it is possible to quantitatively evaluate the adsorption characteristics of contaminants that contaminate the cleaning member.

Third Embodiment

Figure 6:
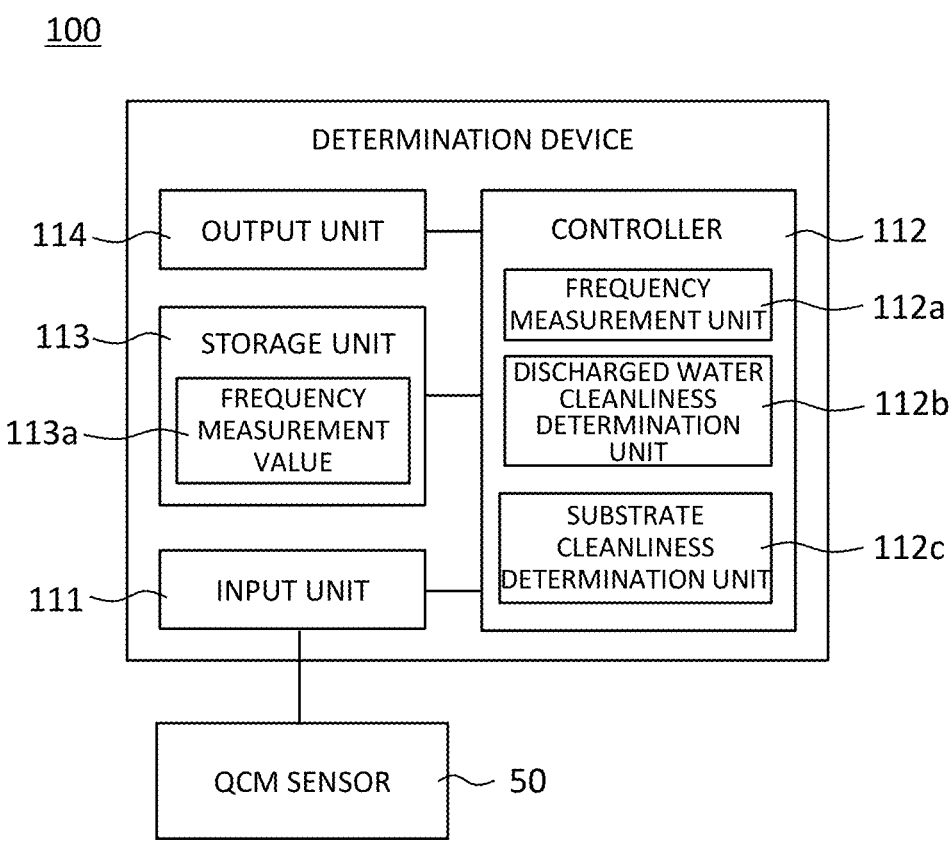
FIG. 6 is a block diagram illustrating a configuration of a determination device according to the third embodiment.
Figure 8:
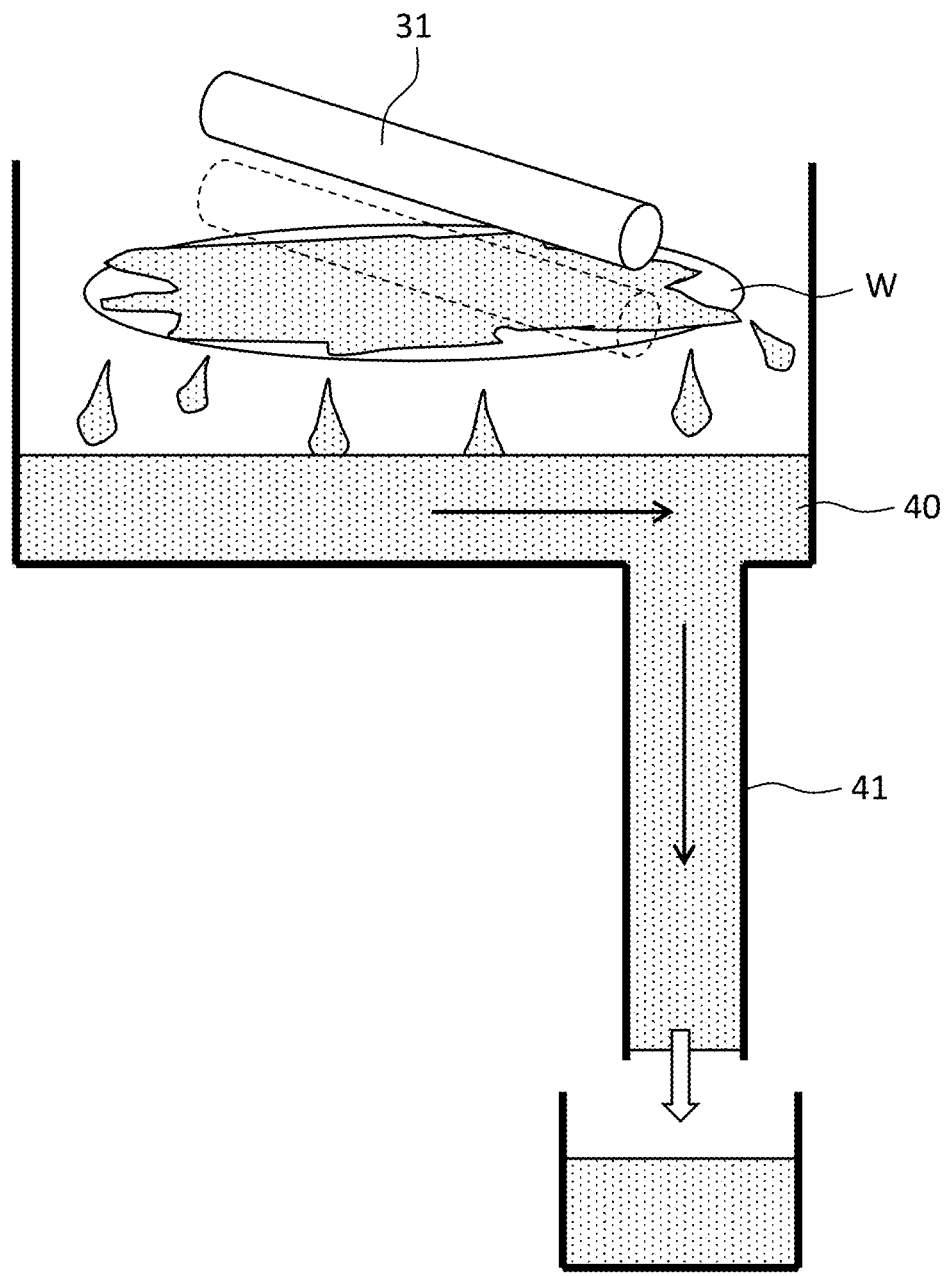
FIG. 8 is a diagram for describing a step of sampling part of the discharged water used for washing the substrate with water in the third embodiment.
Figure 9:
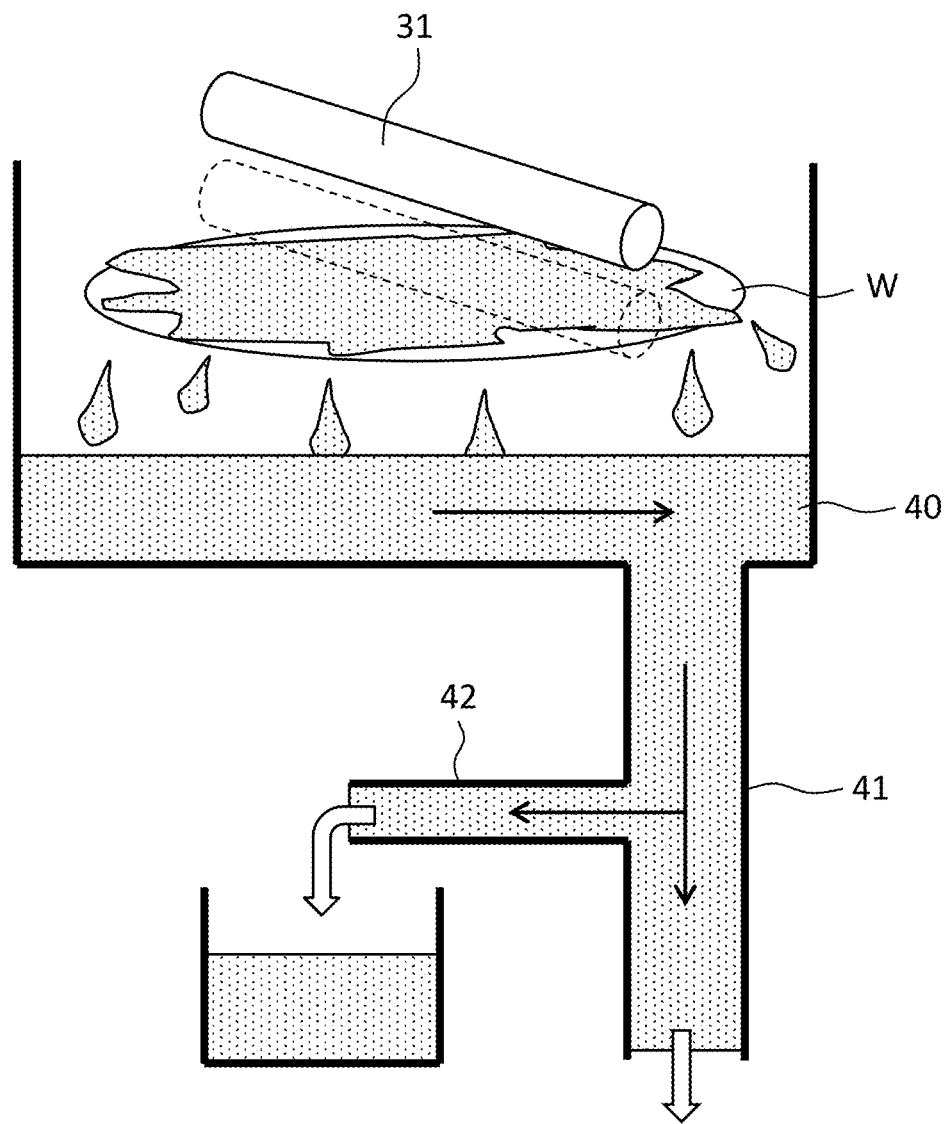
FIG. 9 is a diagram for describing a modification of a step of sampling part of the discharged water used for washing the substrate with water in the third embodiment.

Next, the third embodiment will be described. FIG. 6 is a block diagram illustrating a configuration of a determination device 100 according to the third embodiment. With reference to FIGS. 8 and 9, the determination device 100 according to the third. embodiment is a device that determines cleanliness of a substrate W which the cleaning member 31 is brought into contact with and on which scrub cleaning is performed.

As illustrated in FIG. 6, the determination device 100 has an input unit 111, a controller 112, a storage unit 113, and an output unit 114. The respective units are communicably connected to each other via a bus.

Among these, the input unit Ill is a communication interface between the quartz crystal microbalance (QCM) sensor 50 and the determination device 100. The input unit 111 receives data of the frequency of the crystal oscillator output from the QCM sensor 50.

The output unit 114 is an interface that outputs various types of information from the determination device 100 to the user, and is, for example, a video display unit such as a liquid crystal display or an audio output unit such as a speaker. A determination result by a substrate cleanliness determination unit 112*c* described later is output to the user via the output unit 114.

The storage unit 113 is, for example, a nonvolatile data storage such as a flash memory. The storage unit 113 stores various pieces of data handled by the controller 112. In addition, a measurement value 113*a* of the frequency of the crystal oscillator measured by a frequency measurement unit 112*a* described later is recorded in the storage unit 113.

The controller 112 is a control unit that performs various processes of the determination device 100. As illustrated in FIG. 6, the controller 112 has the frequency measurement unit 112*a*, a discharged water cleanliness determination unit 112*b*, and the substrate cleanliness determination unit 112*c*. These units may be implemented by a processor in the determination device 100 executing a predetermined program, or may be implemented by hardware.

When the substrate W is washed with water after cleaning the substrate by bringing the cleaning member 31 into contact with the substrate W while supplying the chemical solution, the frequency measurement unit 112*a* measures, as a first frequency measurement value, the frequency of the crystal oscillator in which the contaminants contained in the discharged water 40 are deposited on the electrode when part of the discharged water 40 used for washing the substrate W with water at the first timing is sampled, and the sampled discharged water 40 is supplied to the electrode of the crystal oscillator of the QCM sensor 50 and then evaporated In addition, the frequency measurement unit 112*a* measures, as a second frequency measurement value, the frequency of the crystal oscillator in which the contaminants contained in the discharged water are deposited on the electrode when part of the discharged water 40 used for washing the substrate W with water at second timing different from the first timing is sampled, and the sampled discharged water 40 is supplied to the electrode of the crystal oscillator of the QCM sensor 50 and then evaporated. The first frequency measurement value and the second frequency measurement value as the frequency measurement value 113*a* are stored in the storage unit 113.

The discharged water cleanliness determination unit 112*b* determines cleanliness of the discharged water 40 based on the first frequency measurement value and the second frequency measurement value measured by the frequency measurement unit 112*a*. For example, the discharged water cleanliness determination unit 112*b* compares the first frequency measurement value with the second frequency measurement value, and when the second frequency measurement value is less than the first frequency measurement value, the discharged water cleanliness determination unit 112*b* determines that the discharged water 40 is "clean", and when the second frequency measurement value is greater than or equal to the first frequency measurement value, the discharged water cleanliness determination unit 112*b* determines that the discharged water is "contaminated" (contaminants remains in the discharged water 40).

A substrate cleanliness determination unit 113*b* determines cleanliness of the substrate W based on cleanliness of the discharged water 40 determined by the discharged water cleanliness determination unit 112*b*. For example, the substrate cleanliness determination unit 113*b* determines that the substrate W is "clean" when the discharged water 40 is "clean", and determines that the substrate W is "contaminated" (contaminants remain on the substrate) when the discharged water 40 is "contaminated".

Figure 7:
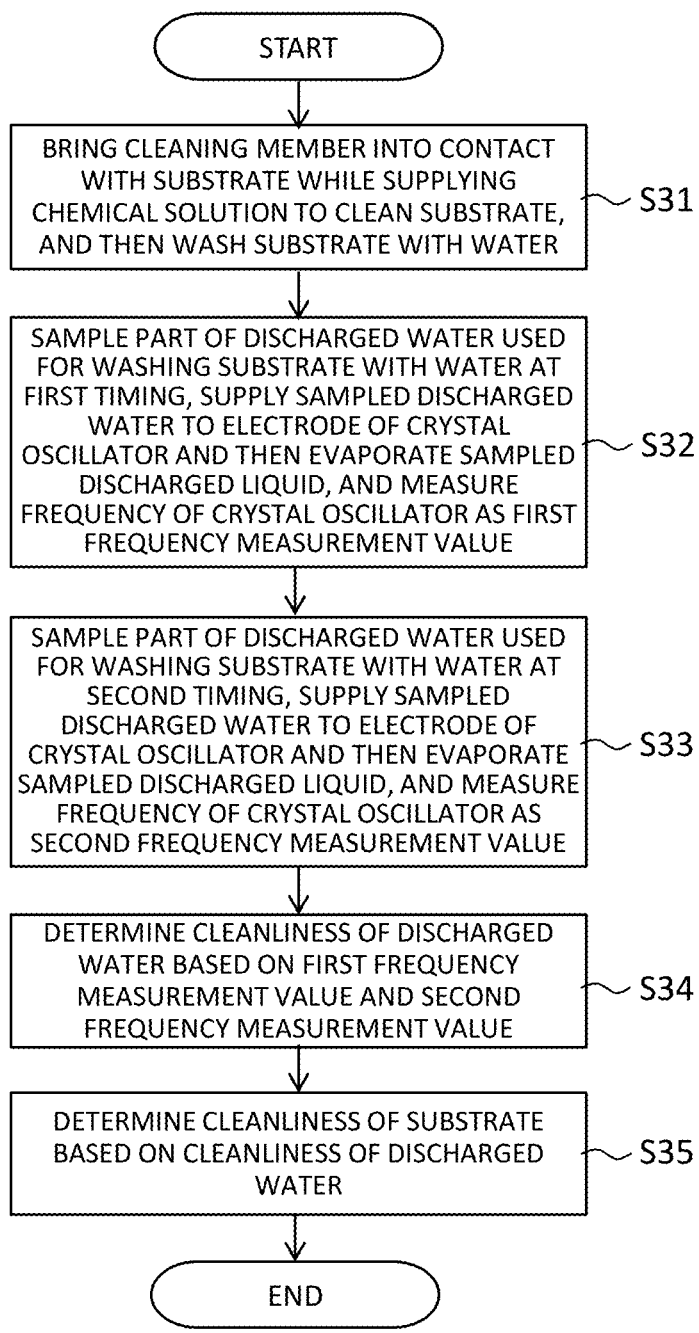
FIG. 7 is a flowchart illustrating a determination method according to the third embodiment.

Next, a determination method according to the third embodiment will be described. FIG. 7 is a flowchart illustrating a determination method according to the third. embodiment.

As illustrated in FIGS. 7 and 8, first, the substrate W is cleaned by bringing the cleaning member 31 into contact with the substrate W while supplying a chemical solution onto the substrate W, and then the cleaning member 31 is away from the substrate W, and then pure water is supplied onto the substrate H to wash away contaminants on the substrate W (wash the substrate W with water) (step S31).

Next, the user samples part of the discharged water 40 used to wash the substrate W with water at the first timing. Here, as illustrated in FIG. 8, part of the discharged water 40 may be sampled from a discharged water pipe 41, or as illustrated in FIG. 9, may be sampled from a branch pipe 42 branched from the discharged water pipe 41. Then, the user supplies the sampled discharged water to the electrode of the crystal oscillator and then evaporates the sampled discharged water, thereby depositing contaminants on the electrode. Then, the frequency measurement unit 112*a* measures, as a first frequency measurement value, the frequency of the crystal oscillator in which contaminants are deposited on the electrode (step S32).

Next, the user samples part of the discharged water 40 used for washing the substrate W with water at second timing different from the first timing from the discharged water pipe 41 or the branch pipe 42, supplies the sampled discharged water to the electrode of the crystal oscillator, and then evaporates the sampled discharged water, thereby depositing contaminants on the electrode. Then, the frequency measurement unit 112*a* measures, as a second frequency measurement value, the frequency of the crystal oscillator in which contaminants are deposited on the electrode (step S33).

Next, the discharged water cleanliness determination unit 112b determines cleanliness of the discharged water 40 based on the first frequency measurement value and the second frequency measurement value measured by the frequency measurement unit 112a (step S34). For example, the discharged water cleanliness determination unit 112b compares the first frequency measurement value with the second frequency measurement value, and when the second frequency measurement value is less than the first frequency measurement value, the discharged water cleanliness determination unit 112b determines that the discharged water 40 is "clean", and when the second frequency measurement value is greater than or equal to the first frequency measurement value, the discharged water cleanliness determination unit 112b determines that the discharged water is "contaminated" (contaminants remains in the discharged water 40).

Then, the substrate cleanliness determination unit 113b determines cleanliness of the substrate W based on cleanliness of the discharged water 40 determined by the discharged water cleanliness determination unit 112b (step S35). For example, the substrate cleanliness determination unit 113b determines that the substrate W is "clean" when the discharged water 40 is "clean", and determines that the substrate W is "contaminated" (contaminants remain on the substrate) when the discharged water 40 is "contaminated". The determination result by the substrate cleanliness determination unit 113b is output to the user via the output unit 114.

According to the present embodiment as described above, since the mass of contaminants is measured based on the measurement of the frequency of the crystal oscillator, it is possible to detect even a very small mass of contaminants, and cleanliness of the discharged water 40 is determined based on the measurement result and cleanliness of the substrate W is determined based on the determination result, so that it is less likely that the substrate W with residual contaminants will be mistakenly determined to be "clean", that is, it is possible to accurately determine cleanliness of the substrate W.

Fourth Embodiment

Figure 10:
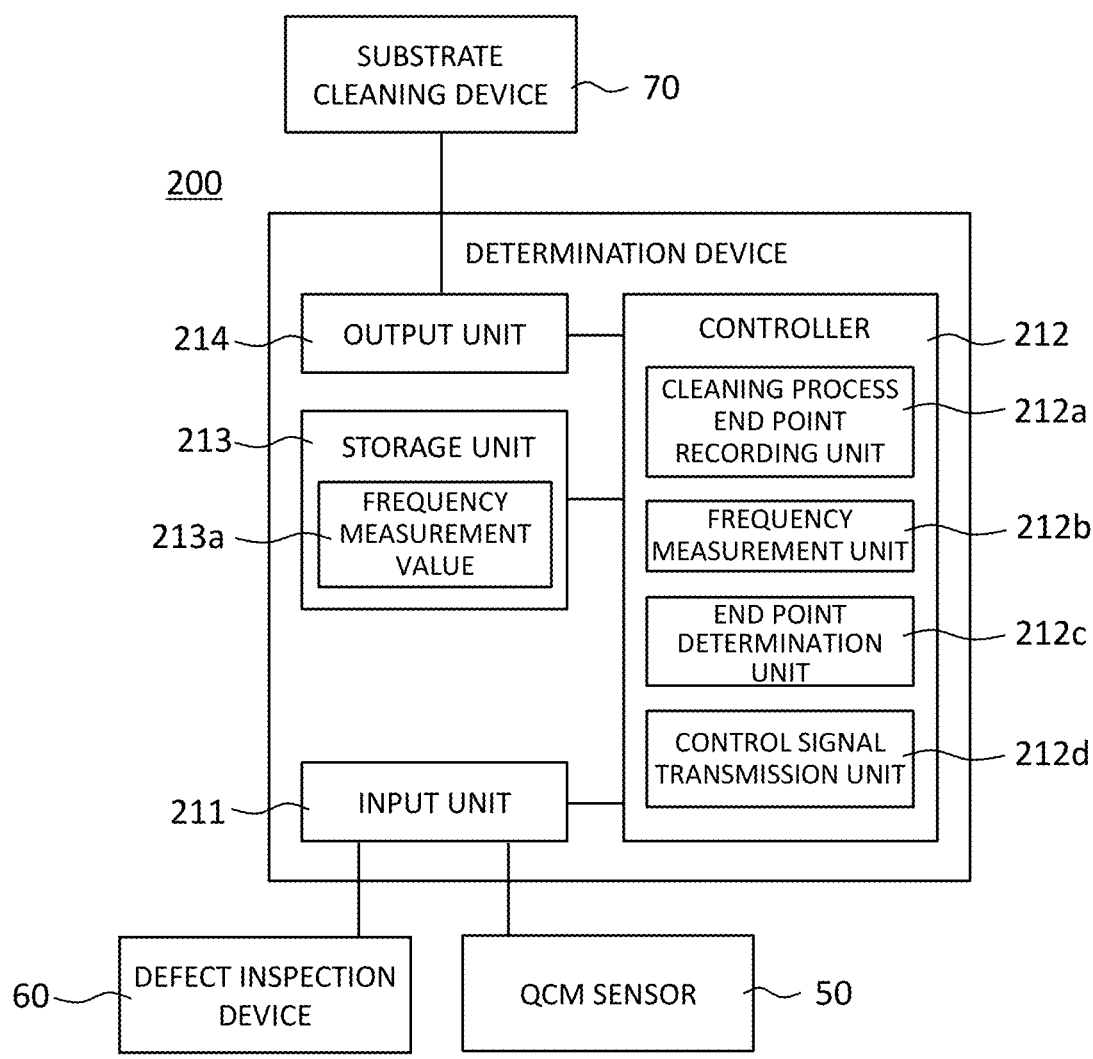
FIG. 10 is a block diagram illustrating a configuration of a determination device according to the fourth embodiment.

Next, the fourth embodiment will be described. FIG. 10 is a block diagram illustrating a configuration of a determination device 200 according to the fourth embodiment. The determination device 200 according to the fourth embodiment is a device that determines the end point of the cleaning process in a substrate cleaning device 70 that continuously cleans the plurality of substrates W.

As illustrated in FIG. 10, the determination device 200 has an input unit 211, a controller 212, a storage unit 213, and an output unit 214. The respective units are communicably connected to each other via a bus.

Among these, the input unit 211 is a communication interface between the quartz crystal microbalance (QCM) sensor 50 and the determination device 200. The input unit 211 receives data of the frequency of the crystal oscillator output from the QCM sensor 50.

The output unit 214 is a communication interface between the controller of the substrate cleaning device 70 and the determination device 200. A control signal generated by a control signal transmission unit 212d to be described later is output to the controller of the substrate cleaning device 70 via the output unit 214.

The storage unit 213 is, for example, a nonvolatile data storage such as a flash memory. The storage unit 213 stores various pieces of data handled by the controller 212. A first frequency measurement value 213a evaluated as an end point of a cleaning process by a cleaning process end point recording unit 212a described later is recorded in the storage unit 213.

The controller 212 is a control unit that performs various processes of the determination device 200. As illustrated in FIG. 10, the controller 212 has the cleaning process end point recording unit 212a, a frequency measurement unit 212b, an end point determination unit 212c, and the control signal transmission unit 212d. These units may be implemented by a processor in the determination device 200 executing a predetermined program, or may be implemented by hardware.

When the cleaning member is brought into contact with the first substrate W1 while supplying a chemical solution to clean the first substrate W1, and then the first substrate W1 is washed with water in the substrate cleaning device 70, the cleaning process end point recording unit 212a measures, as a first frequency measurement value, the frequency of the crystal oscillator in which the contaminants contained in the discharged water are deposited on the electrode when part of the discharged water used for washing the first substrate W1 with water is sampled, and the sampled discharged water is supplied to the electrode of the crystal oscillator of the QCM sensor 50 and then evaporated. In addition, the cleaning process end point recording unit 212a acquires, from a defect inspection device 60, the number of defects on the first substrate W1 evaluated by the defect inspection device 60 after the first substrate W1 washed with water is dried. When the number of defects acquired from the defect inspection device 60 falls below a predetermined reference value, the cleaning process end point recording unit 212a records the first frequency measurement value 213a as the end point of the cleaning process in a recording unit 213.

When the cleaning member is brought into contact with a second substrate W2 while supplying the chemical solution to clean the second substrate W2, and then the second substrate W2 is washed with water in the substrate cleaning device 70, the frequency measurement unit 212b measures, as a second frequency measurement value, the frequency of the crystal oscillator in which the contaminants contained in the discharged water are deposited on the electrode when part of the discharged water 40 used for washing the second substrate W2 with water is sampled, and the sampled discharged water 40 is supplied to the electrode of the crystal oscillator of the QCM sensor 50 and then evaporated.

The end point determination unit 212c compares the first frequency measurement value 213a recorded in the recording unit 213 with the second frequency measurement value measured by the frequency measurement unit 212b, and when the second frequency measurement value is greater than or equal to the first frequency measurement value, the end point determination unit 212c determines that the end point of the cleaning process is reached, and when the second frequency measurement value is less than the first frequency measurement value, the end point determination unit 212c determines that the end point of the cleaning process is not reached.

When the end point determination unit 212c determines that the end point is reached, the control signal transmission unit 212d transmits a first control signal for stopping the cleaning process and starting the drying process for the second substrate W2 to the controller of the substrate cleaning device 70 via the output unit 214. When the end point determination unit 212c determines that the end point is not reached, the control signal transmission unit 212d transmits a second control signal for continuing the cleaning process for the second substrate W2 to the controller of the substrate cleaning device 70 via the output unit 214.

Figure 11A:
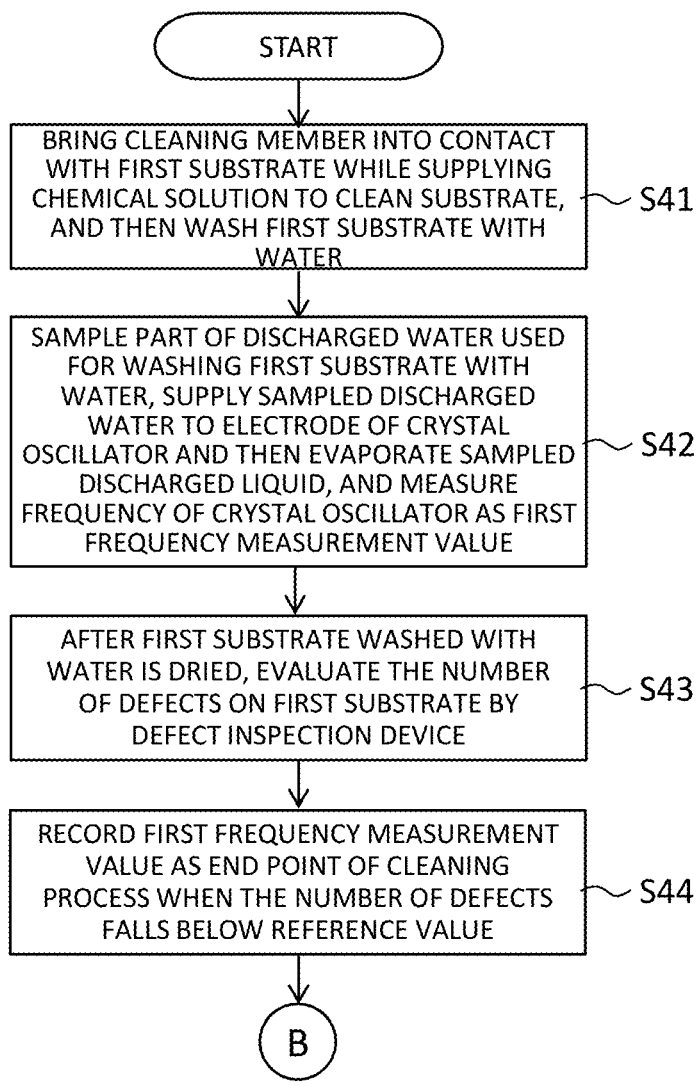
FIG. 11A is a flowchart illustrating a determination method according to the fourth embodiment.
Figure 11B:
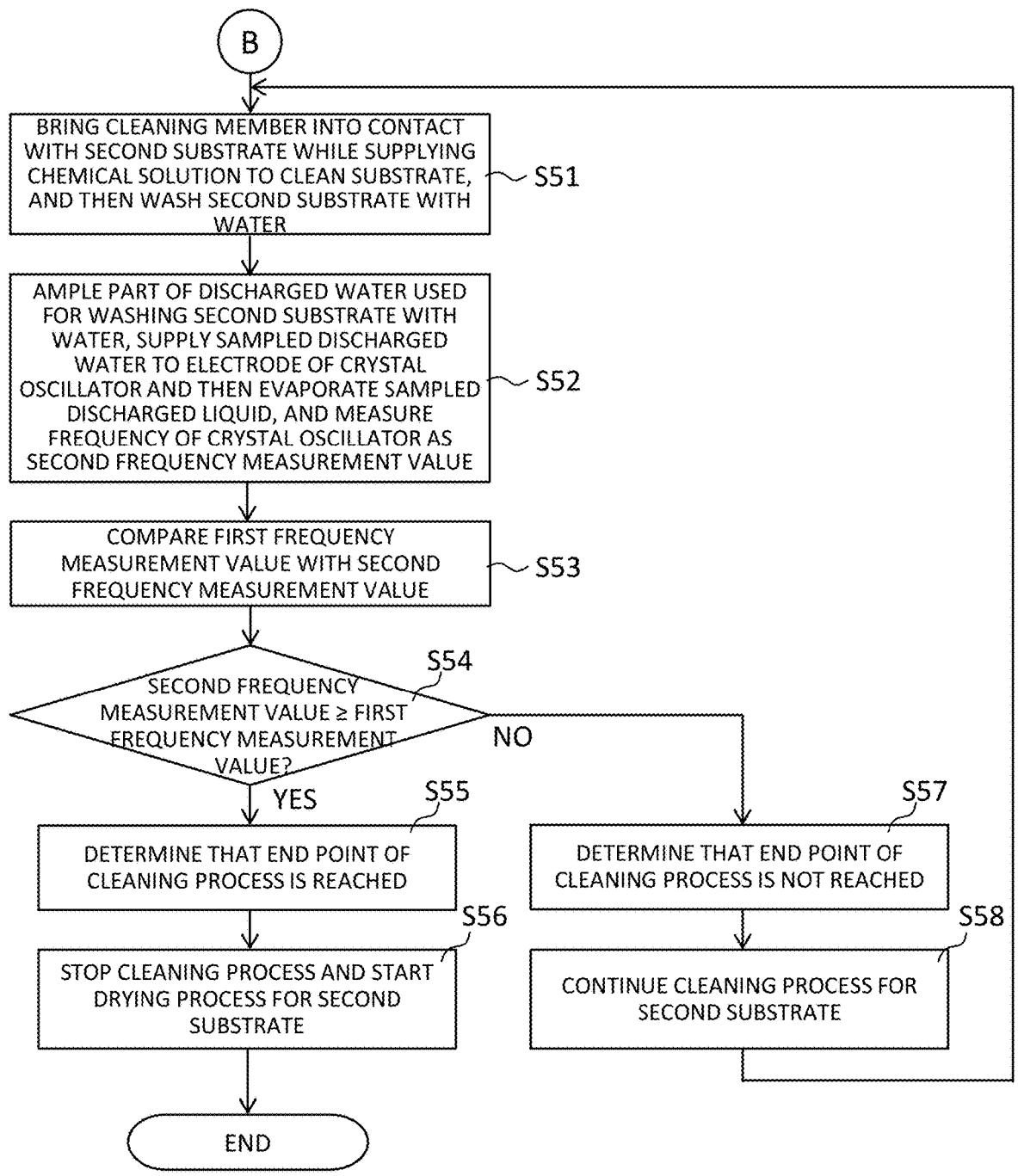
FIG. 11B is a flowchart illustrating a determination method according to the fourth embodiment.

Next, a determination method according to the fourth embodiment will be described. FIGS. 11A and 11B are flowcharts illustrating the determination method according to the fourth embodiment.

As shown in FIG. 11A, first, in the substrate cleaning device 70, the cleaning member is brought into contact with the first substrate W1 while supplying the chemical solution onto the first substrate W1 to clean the first substrate W1, and then the cleaning member is away from the first substrate W1, next, pure water is supplied onto the first substrate W1 to wash away contaminants on the first substrate W1 (wash the first substrate W1 with water) (step S41).

Next, the user samples part of the discharged water used for washing the first substrate W1 with water, supplies the sampled discharged water to the electrode of the crystal oscillator of the QCM sensor 50, and then evaporates the sampled discharged water, thereby depositing contaminants on the electrode. Then, the cleaning process end point recording unit 212a measures, as a first frequency measurement value, the frequency of the crystal oscillator in which contaminants are deposited on the electrode (step S42).

Next, after the first substrate W1 washed with water is dried, the number of defects on the first substrate W1 is evaluated by the defect inspection device 60 (step S43). The cleaning process end point recording unit 212a acquires the number of defects on the first substrate W1 from the defect inspection device 60, compares the acquired number of defects with a predetermined reference value, and when the number of acquired defects falls below the predetermined reference value, records The first frequency measurement value 213a measured in step S42 as the end point of the cleaning process in the recording unit 213 (step S44).

Figure 12A:
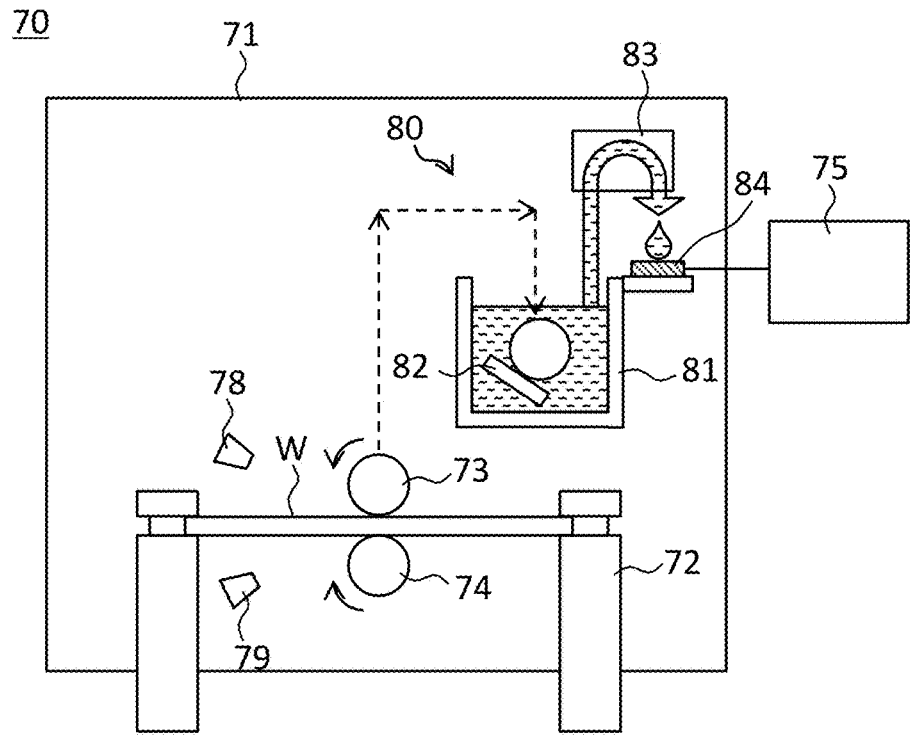
FIG. 12A is a schematic diagram illustrating a configuration of a substrate cleaning device according to the fifth embodiment.
Figure 12B:
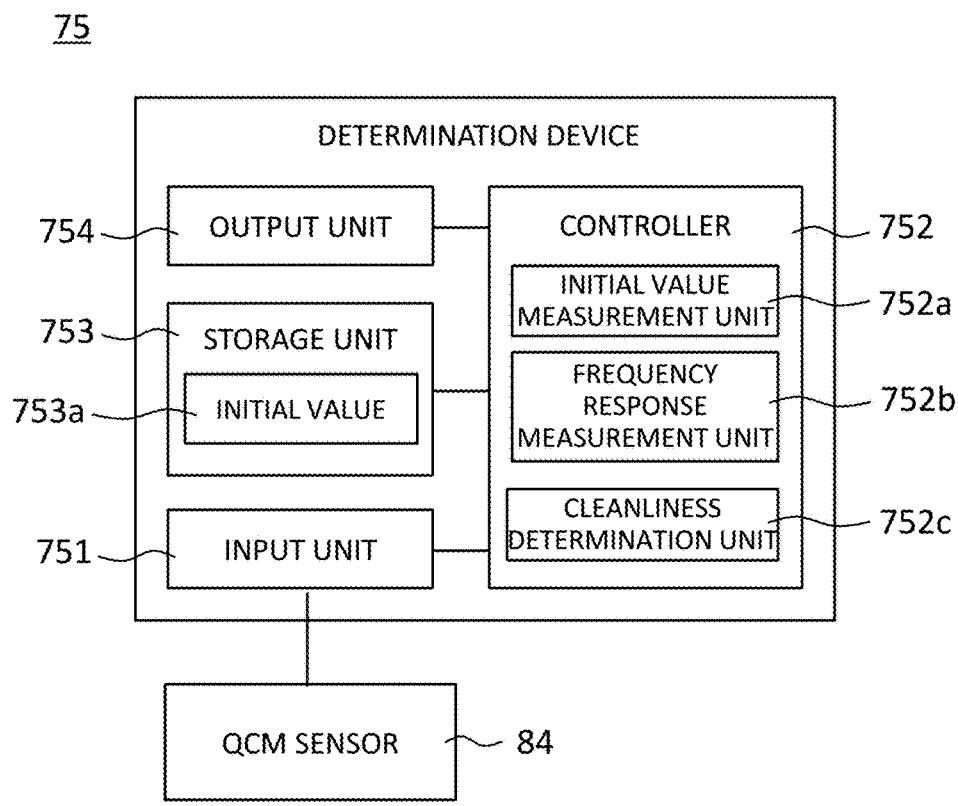
FIG. 12B is a block diagram illustrating a configuration of the determination device according to the fifth embodiment.

Then, as shown in FIG. 12B, in the substrate cleaning device 70, the cleaning member is brought into contact with the second substrate W2 while supplying a chemical solution onto a second substrate W2 different from the first substrate W1 to clean the second substrate W2, and then the cleaning member is away from the second substrate W2, and next, pure water is supplied onto the second substrate W2 to wash away contaminants on the second substrate W2 (wash the second substrate W2 with water) (step S51).

Next, the user samples part of the discharged water used for washing the second substrate W2 with water, supplies the sampled discharged water to the electrode of the crystal oscillator of the QCM sensor 50, and then evaporates the sampled discharged water, thereby depositing contaminants on the electrode. Then, the frequency measurement unit 212b measures, as a second frequency measurement value, the frequency of the crystal oscillator in which contaminants are deposited on the electrode (step S52).

Next, the end point determination unit 212c compares the first frequency measurement value 213a recorded in the recording unit 213 in step S44 with the second frequency measurement value measured by the frequency measurement unit 212b in step S52 (step 53).

When the second frequency measurement value is greater than or equal to the first frequency measurement value 213a (step S54: YES), the end point determination unit 212c determines that the end point of the cleaning process is reached (step S55). Then, the control signal transmission unit 212d transmits a first control signal for stopping the cleaning process and starting the drying Process for the second substrate W2 to the controller of the substrate cleaning device 70 via the output unit 214 (step S56).

On the other hand, when the second frequency measurement value is less than the first frequency measurement value 213a (step S54: NO), it is determined that the end point of the cleaning process is not reached (step S57). Then, the control signal transmission unit 212d transmits a second control signal for continuing the cleaning process for the second substrate W2 to the controller of the substrate cleaning device 70 via the output unit 214 (step S58).

According to the present embodiment as described above, for the second substrate W2 and subsequent substrates, it is possible to determine cleanliness of each of any number of substrates W (possible for all substrates) to be processed that are continuously introduced into the scrub cleaning process without the need for evaluation by the defect inspection device 70 after cleaning. Moreover, since the mass of contaminants as measured based on the measurement of the frequency of the crystal oscillator, it is possible to detect even a very small mass of contaminants, and cleanliness of the discharged water 40 is determined based on the measurement result and cleanliness of the substrate W is determined based on the determination result, so that it is less likely that the substrate W on which contaminants remain is erroneously determined to be "clean". As a result, for the second substrate W1 and the subsequent substrates, it is possible to more appropriately and accurately determine cleanliness of the substrate W while suppressing a decrease in throughput at the time of cleaning without requiring evaluation by the defect inspection device for all the cleaned substrates.

Fifth Embodiment

FIG. 12A is a schematic diagram illustrating a configuration of the substrate cleaning device 70 according to the fifth embodiment. As illustrated in FIG. 12A, the substrate cleaning device 70 has a housing 71, a rotation holder 72, cleaning members 73 and 74, cleaning liquid nozzles 78 and 79, a self-cleaning device 80, a QCM sensor 84, a pump 83, and a determination device 75.

Among them, the housing 71 accommodates the substrate W to be cleaned therein and prevents The cleaning liquid from scattering outside during cleaning of the substrate W. The rotation holder 72 is, for example, a rotation roller, holds the outer edge of the substrate W in the housing 71, and rotates the substrate W about the central axis line thereof. The cleaning liquid nozzles 78 and 79 are disposed in the housing 71 and supply cleaning liquid for substrate cleaning to the front face and the back face of the substrate W held by the rotation holder 72.

The cleaning members 73 and 74 have a roll shape, are disposed in the housing 71, and are brought into contact with the front face and the back face of the substrate W held by the rotation holder 72 to perform scrub cleaning. As the cleaning members 73 and 74, for example, a polyvinyl alcohol (PVA) brush is used.

The self-cleaning device 80 is disposed in the housing 71 and releases contaminants from the cleaning members 73 and 74 into the self-cleaning cleaning liquid during the break-in process for the cleaning members 73 and 74 or after scrubbing the substrate W to self-clean the cleaning members 73 and 74. As the cleaning liquid for self-cleaning, for example, pure water, ammonia water, an aqueous solution containing a cleaning liquid, or the like is used.

In the example illustrated in FIG. 12A, the self-cleaning device 80 has a water tank 81 that stores a cleaning liquid for self-cleaning, and a plate-shaped self-cleaning member 82 disposed in the cleaning liquid in the water tank 81. During the break-in process for the cleaning members 73 and 74, or after the scrub cleaning the substrate W, the cleaning members 73 and 74 are immersed in the cleaning liquid in the water tank 81, and while the cleaning members 73 and 74 are rotated around their central axis lines, the self-cleaning member 82 is pressed against the surfaces of the cleaning members 73 and 74, so that the contaminants attaching to the surfaces of the cleaning members 73 and 74 are released into the cleaning liquid.

Figure 13A:
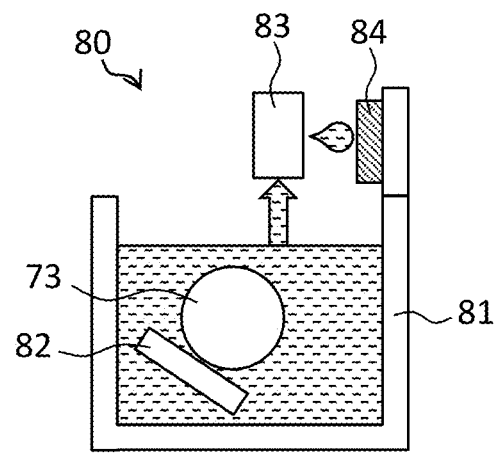
FIG. 13A is a schematic diagram illustrating a modification of the configuration of a self-cleaning device according to the fifth embodiment.
Figure 13B:
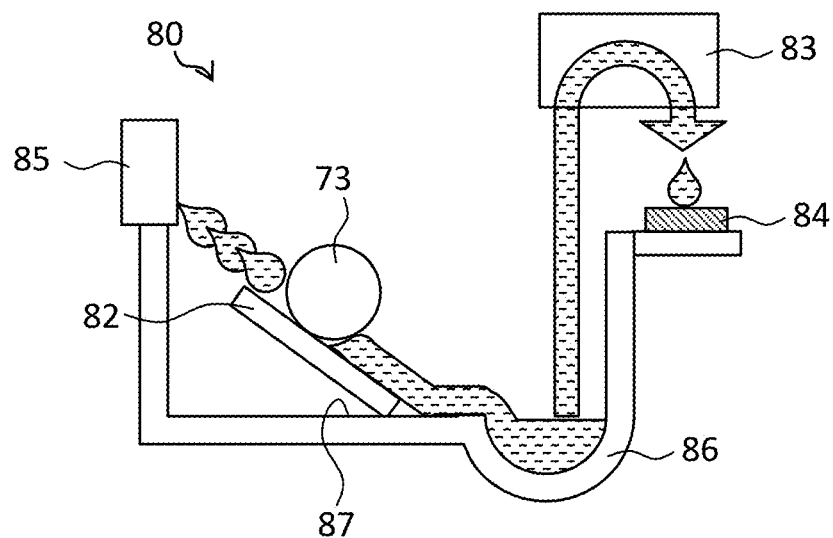
FIG. 13B is a schematic diagram illustrating a modification of the configuration of the self-cleaning device according to the fifth embodiment.

As a modification, as shown in FIG. 13B, the self-cleaning device 80 has an injection nozzle 85 that injects a cleaning liquid for self-cleaning, and the self-cleaning member 82, and while the cleaning member 73 is rotated around its central axis line, the cleaning liquid is ejected from the injection nozzle 85 toward the surface of the cleaning member 73, and at the same time, the self-cleaning member 82 is pressed against the surface of the cleaning member 73, so that the contaminants attaching to the surface of the cleaning member 73 may be released into the cleaning liquid. In this case, the discharged liquid containing contaminants is stored in a discharged liquid drain 86.

Figure 13C:
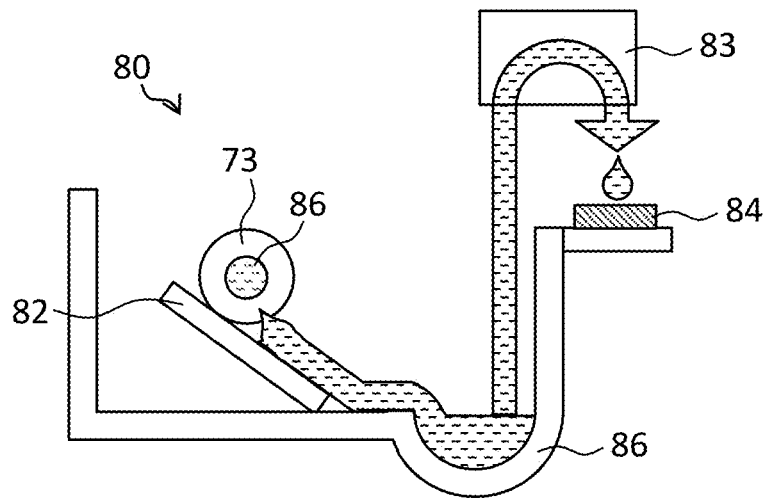
FIG. 13C is a schematic diagram illustrating a modification of the configuration of the self-cleaning device according to the fifth embodiment.

As another modification, as shown in FIG. 13C, the self-cleaning device 80 has an inner rinsing unit 86 that supplies a cleaning liquid for self-cleaning to the inside of the cleaning member 73, and the self-cleaning member 82, and while the cleaning member 73 is rotated around its central axis line, the cleaning liquid flows into the cleaning member 73 from the inner rinsing unit 86, the cleaning liquid flows out from the surface of the cleaning member, and the self-cleaning member 82 is pressed against the surface of the cleaning member 73, so that the contaminants that have entered the inside of the cleaning member 73 and the contaminants that have attached to the surface of the cleaning member 73 may be released into the cleaning liquid. Also in this case, the discharged liquid containing contaminants is stored in the discharged liquid drain 86.

Figure 13D:
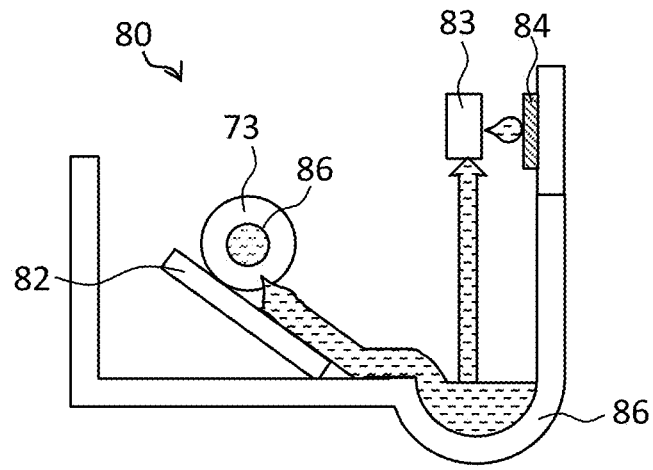
FIG. 13D is a schematic diagram illustrating a modification of the configuration of the self-cleaning device according to the fifth embodiment.

The QCM sensor 84 is disposed in the housing 71 and positioned adjacent to the self-cleaning device 80. In the examples shown in FIGS. 12A, 13B, and 13C, in the QCM sensor 84, the electrode of the crystal oscillator is disposed horizontally upward in the atmosphere, but the present invention is not limited to this. As shown in FIGS. 13A and 13D, it may be disposed vertically sideways or although not shown, may be disposed horizontally downward. In the case of the horizontal downward direction, preferably, it is possible to prevent the discharged liquid scattered during the self-cleaning from attaching onto the electrode. When disposed vertically sideways, it is preferable that it faces outward with respect to the cleaning tank 71 so that the discharged liquid scattered during the self-cleaning does not attach onto the electrode. When disposed horizontally upward, or vertically sideways and inward with respect to the cleaning device 71, an openable shutter (not illustrated) is preferably provided so as to cover the electrode so that the discharged liquid scattered during the self-cleaning does not attach onto the electrode.

The pump 83 sucks the cleaning liquid (discharged liquid after the self-cleaning) in the water tank 71 or the discharged liquid in the discharged liquid drain 86, and discharges the liquid so that the liquid comes into contact with the electrode of the crystal oscillator of the QCM sensor 84. As the pump 83, for example, a liquid feeding pump or a syringe pump may be used. As a modification, an elevating unit (not shown) is provided instead of the pump 83, and immerses the QCM sensor 84 in The cleaning liquid (discharged liquid after self-cleaning) in the water tank 71 or the discharged liquid in the discharged liquid drain 86, then pulls up it into the atmosphere, so that the discharged liquid may be brought into contact with the electrode of the crystal oscillator.

Figure 13E:
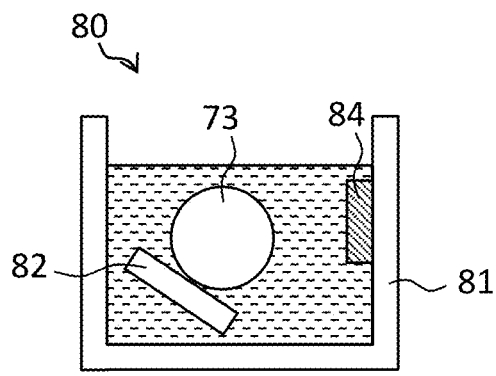
FIG. 13E is a schematic diagram illustrating a modification of the configuration of the self-cleaning device according to the fifth embodiment.
Figure 13F:
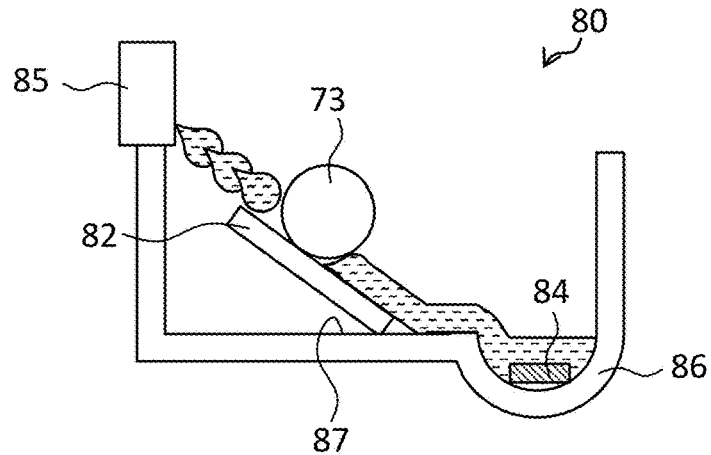
FIG. 13F is a schematic diagram illustrating a modification of the configuration of the self-cleaning device according to the fifth embodiment.
Figure 13G:
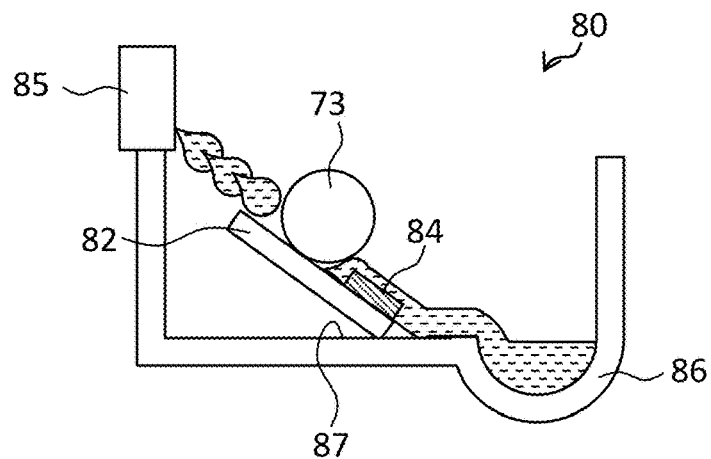
FIG. 13G is a schematic diagram illustrating a modification of the configuration of the self-cleaning device according to the fifth embodiment.
Figure 13H:
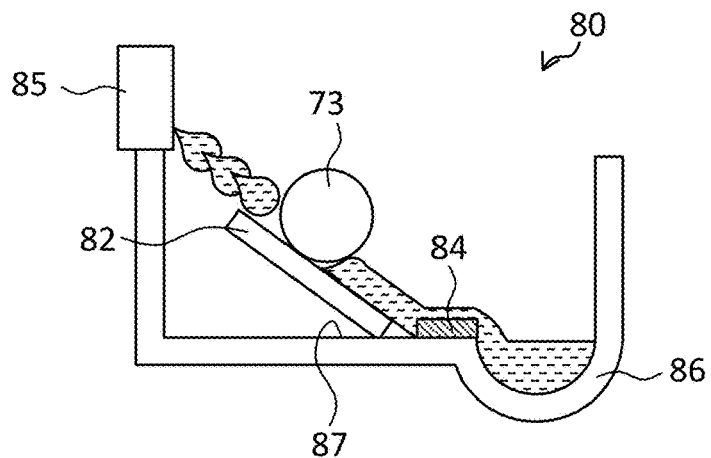
FIG. 13H is a schematic diagram illustrating a modification of the configuration of the self-cleaning device according to the fifth embodiment.
Figure 13I:
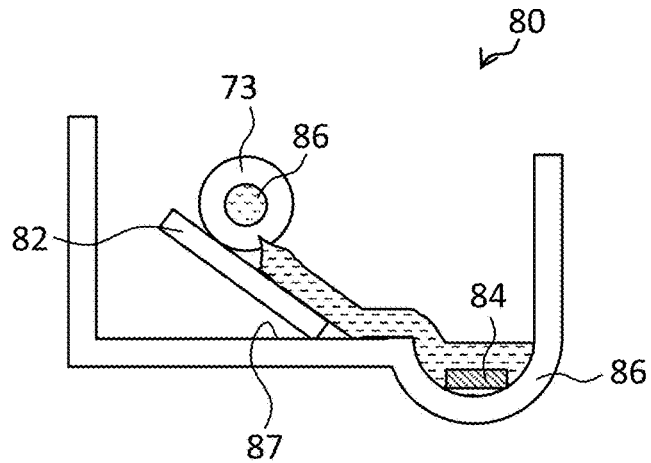
FIG. 13I is a schematic diagram illustrating a modification of the configuration of the self-cleaning device according to the fifth embodiment.
Figure 13J:
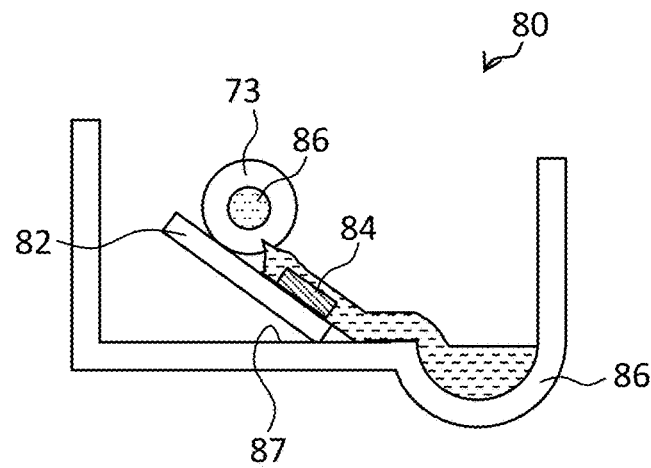
FIG. 13J is a schematic diagram illustrating a modification of the configuration of the self-cleaning device according to the fifth embodiment.
Figure 13K:
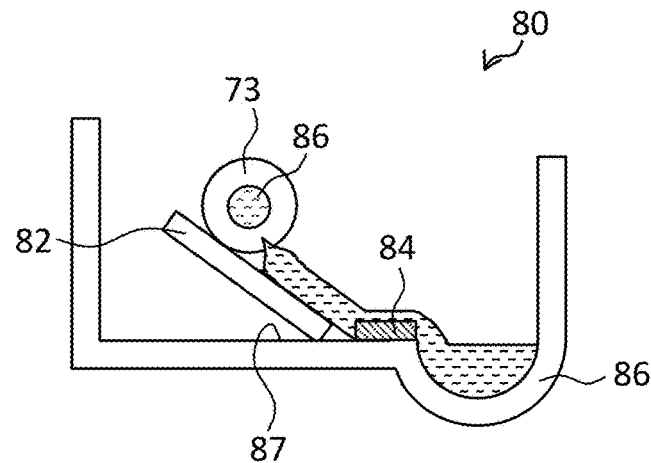
FIG. 13K is a schematic diagram illustrating a modification of the configuration of the self-cleaning device according to the fifth embodiment.

In the example shown in FIGS. 12A and 13A to LTD, the QCM sensor 84 is disposed in the atmosphere, but the present invention is not limited thereto. As shown in FIGS. 13E to 13K, the QCM sensor 84 may be disposed in the self-cleaning discharged liquid. For example, when the self-cleaning device 80 has the water tank 81 that stores the cleaning liquid for self-cleaning, the QCM sensor 84 may be disposed at a position lower than the liquid level of the cleaning liquid in the water tank 81 as illustrated in FIG. 13E. When the self-cleaning device 80 has the injection nozzle 85 for injecting a cleaning liquid for self-cleaning, the QCM sensor 84 may be disposed in the discharged liquid drain 86 as shown in FIG. 13F, or may be disposed on the self-cleaning member 82 and below the cleaning member 73 as shown in FIG. 13G, or may be disposed on a bottom plate 87 between the self-cleaning member 82 and the discharged liquid drain 86 as shown in FIG. 13H. When the self-cleaning device 80 has the inner rinsing unit 86 that supplies a cleaning liquid for self-cleaning to the inside of the cleaning member 73, the QCM sensor 84 may be disposed in the discharged liquid drain 86 as shown in FIG. 13I, or may be disposed on the self-cleaning member 82 and below the cleaning member 73 as shown in FIG. 13J, or may be disposed on the bottom plate 87 between the self-cleaning member 82 and the discharged liquid drain 86 as shown in FIG. 13K.

As shown in FIGS. 13E to 13K, when the QCM sensor 84 is disposed in the self-cleaning discharged liquid, an adsorption film. that adsorbs contaminants by one or both actions of chemical adsorption (adsorption by hydrogen bonds) and physical adsorption (adsorption by van der Waals force) may be fixed on the electrode of the crystal oscillator of the QCM sensor 84.

A method for manufacturing the PVA brush is usually as follows. That is, first, polyvinyl alcohol is dissolved in warm water to prepare a polyvinyl alcohol aqueous solution of about 5 to 15 wt %. A liquid in which starch as a pore generating material is dispersed in water is put into the solution. This solution is heated to a temperature around the α (alpha) conversion temperature of starch, then, an aqueous solution of sulfuric acid and formaldehyde is further added, and then the mixture is sufficiently stirred and mixed to form a uniform slurry-like stock solution. A certain amount of the stock solution is poured into a predetermined mold. When the mixture is reacted at about 60° C. for 10 hours or more as it is, and compressed and washed with water after completion of the reaction, unreacted aldehyde, acid, and starch fine powder are removed and separated to form a sponge sheet (PVA brush) made of a polyvinyl acetal-based porous body. The saponification degree of polyvinyl alcohol is 97% or more, the polymerization degree of polyvinyl alcohol is 300 to 2000, and the acetalization degree is 50 to 80%. When the acetalization degree is more than 80%, it is hard even when wetted with water, and is not suitable for use. The PVA brush thus obtained finally has 50 to 80% of acetal groups and 20 to 50% of OH groups (hydroxy groups). The action of the OH group (hydroxy group) greatly affects the surface physical properties of the OVA brush.

Examples of the contaminants released from the cleaning member (PVA brush) include (1) contaminants due to the cleaning member cleaning process, (2) contaminants from the device, and (3) contaminants released after wafer cleaning. More specifically, examples of (1) contaminants due to the cleaning member cleaning process include a pore generating material (starch fine powder or the like), a sponge sheet material (cross-linked molecules, uncross-linked molecules, and the like of polyvinyl acetal) made of a resin porous body, and other raw materials (polyvinyl alcohol, aldehyde, and the like). More specifically, examples of (2) contamination from the device include framework metal, paint, and structural resin. In addition, more specifically, (3) contaminants released after wafer cleaning includes wafer polishing pieces (silica oxide, wiring metal/barrier metal, compounds of metal and chemicals, and the like), polishing chemicals (corrosion preventives, cleaning agents, and the like), and deterioration of cleaning members (sponge sheet materials (cross-linked molecules, non-cross-linked molecules, and the like of polyvinyl acetal) composed of a resin porous body). Among them, the sponge sheet material (cross-linked molecules, uncross-linked molecules, and the like of polyvinyl acetal) composed of the pore generating material (starch fine powder or the like) and the resin porous body is a substance that determines the completion of start-up (break-in process) and the deterioration replacement time of the cleaning member.

Therefore, as the adsorption film, for example, a film that selectively adsorbs starch or polyvinyl acetal from among the above-described contaminants may be used. Specifically, for example, the adsorption film is any one or two or more of (a) a molecular film consisting of an alkyl chain of appropriate length (for example, C=6 to 40) or an alkyl chain having a functional group (hydroxy group, carboxy group, and the like), (b) a molecular film whose functional group is located at the end or middle of the alkyl chain, or at the end or middle of the branched alkyl chain, and (c) a film in which the electrode surface of the QCM sensor is coated with a transition metal (Au, Pt, or the like), an oxide ($SiO2$), or a semiconductor, and the molecular chains are fixed on the surface thereof by a thiol reaction, a silane coupling reaction, or the like. Here, in most cases, both chemical adsorption and physical adsorption contribute to the production of the adsorption film adsorbed by the functional group at a constant ratio, whereas in a case where the molecular film is composed of only an alkyl chain, the influence of van der Waals force (physical force) and hydrophobicity is large, so that the physical adsorption is dominant. Since the alkyl chain has a hydrophobic (hardly hydrogen bonded) property, water molecules are not adsorbed. The contaminants released by cleaning upon brush start-up are starch and the molecular chains of the PVA brush (cross-linked, uncross-linked), which are more likely to bind to alkyl chains than water molecules. In addition, at the time of brush cleaning after use for polishing, an inorganic substance such as abrasive grains or metal enters the contaminants, and the inorganic substance is hardly bonded to the alkyl chain. Therefore, even when only a physical action is used without using a chemical reaction, it is possible to selectively adsorb a specific substance such as starch or polyvinyl alcohol from among contaminants.

Returning to FIG. 12A, the determination device 75 is a device that determines cleanliness of the cleaning members 74 and 75 that contact the substrate W and with which scrub cleaning is performed. The determination device 75 includes one or a plurality of computers.

FIG. 12B is a block diagram illustrating a configuration of determination device 75. As illustrated in FIG. 12B, the determination device 75 has an input unit 751, a controller 752, a storage unit 753, and an output unit 754. The respective units are communicably connected to each other via a bus.

Among these, the input unit 751 is a communication interface between the QCM sensor 84 and the determination device 75. The input unit 751 receives data of the frequency response (that is, the frequency or the phase (delay) of the frequency) of the crystal oscillator output from the QCM sensor 84.

The output unit 754 is an interface that outputs various types of information from the determination device 75 to the user, and is, for example, a video display unit such as a liquid crystal display or an audio output unit such as a speaker. A determination result by a cleanliness determination unit 752*c* described later is output to the user via the output unit 754.

The storage unit 753 is, for example, a nonvolatile data storage such as a flash memory. The storage unit 753 stores various pieces of data handled by the controller 752. In addition, an initial value 753*a* of the frequency response of the crystal oscillator measured by an initial value measurement unit 752*a* described later is recorded in the storage unit 753.

The controller 752 is a control unit that performs various processes of the determination device 75. As illustrated in FIG. 12B, the controller 752 has the initial value measurement unit 752*a*, a frequency response measurement unit 752*b*, and the cleanliness determination unit 752*c*. These units may be implemented by a processor in the determination device 75 executing a predetermined program, or may be implemented by hardware.

The initial value measurement unit 752*a* measures the frequency response of the crystal oscillator of the QCM sensor 50 before the contaminants are attached onto the electrode, and records the measured frequency as the initial value 753*a* in the storage unit 753 (recording medium).

The frequency response measurement unit 752*b* measures the frequency response of the crystal oscillator in which contaminants are attached onto the electrode after the discharged liquid of the self-cleaning device 80 is brought into contact with the electrode of the crystal oscillator of the QCM sensor 84, and contaminants contained in the discharged liquid are attached onto the electrode of the crystal oscillator.

The cleanliness determination unit 752*c* determines cleanliness of the cleaning members 74 and 75 based on the frequency response measured by the frequency response measurement unit 752*b*. For example, cleanliness determination unit 752*c* calculates a difference between the frequency response measured by the frequency response measurement unit 752*b* and the initial value 753*a* with reference to the initial value 753*a*, and measures the amount of the measurement object (for example, contaminants) attached onto the electrode based on the calculated difference. The cleanliness determination unit 752*c* compares the mass of contaminants attaching onto the electrode with a predetermined threshold value, and when the mass of contaminants attaching onto the electrode is below the threshold value, the cleanliness determination unit 752*c* determines that the cleaning member is "clean", and when it is larger than the threshold value, the cleanliness determination unit 752*c* determines that the cleaning member is "contaminated" (contaminants remain in the cleaning member).

As the first example, before the discharged liquid of the self-cleaning device 80 is attached onto the electrode of the crystal oscillator of the QCM sensor 84, and the discharged liquid attached onto the electrode is evaporated, the frequency response measurement unit 752$b$ (a) may measure the frequency response of the crystal oscillator, and the cleanliness determination unit 752$c$ may measure the amount of discharged liquid (X1) attached onto the electrode based on the measured frequency response, or the cleanliness determination unit 752$c$ (b) may measure the amount of contact liquid (X2) with a measuring facility for the volume or the weight or the contact time of the discharged liquid, and next, after the discharged liquid attached onto the electrode is evaporated to deposit contaminants contained in the discharged liquid on the electrode of the crystal oscillator, the frequency response measurement unit 752$b$ may measure the frequency response of the crystal oscillator, and the cleanliness determination unit 752$c$ may measure the mass of the contaminants (Y) deposited on the electrode based on the measured frequency response, calculate a contaminant concentration (Z) of the discharged liquid based on the measured volume of discharged liquid (X1 or X2) and the mass of the contaminants (Y), and determine cleanliness of the cleaning member based on the calculated contaminant concentration (Z). Here, the method for evaporating the discharged liquid attached onto the electrode may be, for example, perform by heating of the electrode surface or constant heat retention at a temperature higher than normal temperature, or may be performed by dry air or gas injection. In addition, the measuring facility for the volume of discharged liquid may be, for example, a displacement type liquid feeding mechanism. such as a syringe pump or a Perista pump, or may be a camera that observes the droplet shape from the side of the electrode surface. The measuring facility for the weight of discharged liquid may be, for example, a mechanism that feeds liquid when a certain weight is reached by a balance type mechanism. The measuring facility for contact time of discharged liquid is, for example, a timer, and since the flow rate of the liquid can be known from the amount of liquid supplied at the time of brush cleaning, the amount of contact liquid may be measured from the flow rate of the liquid, and the immersion time due to vertical movement of the electrode surface, or the immersion time due to opening and closing of the shutter.

As the second example, after a predetermined amount of the discharged liquid of the self-cleaning device 80 is attached onto the electrode of the crystal oscillator of lie QCM sensor 84 and evaporated, and the contaminants contained in the discharged liquid are deposited on the electrode of the crystal oscillator, the frequency response measurement unit 752$b$ may measure the frequency response, of the crystal oscillator, and the cleanliness determination unit 752$c$ may measure the mass of the deposited on the electrode based on the measured frequency response, and may determine cleanliness of the cleaning member based on the measured mass of the contaminants.

As the third example, after a crystal oscillator in which an adsorption film that adsorbs contaminants by one or both actions of chemical adsorption and physical adsorption is fixed on an electrode is immersed in the discharged liquid of the self-cleaning device 80, the contaminants contained in the discharged liquid are adsorbed on the adsorption film, the frequency response measurement unit 752$b$ may measure the frequency response of the crystal oscillator, and the cleanliness determination unit 752$c$ may measure the mass of the contaminants adsorbed on the adsorption film based on the measured frequency response, and may determine cleanliness of the cleaning member based on the measured mass of the contaminants.

In the first example and the second example, in a state where the crystal oscillator of the QCM sensor 50 in which contaminants are deposited on the electrode is immersed in the liquid (for example, pure water), the frequency response measurement unit 752$b$ may measure the temporal change in the frequency response of the crystal oscillator, and the cleanliness determination unit 752$c$ may measure the mass of liquid soluble contaminants based on the difference between the frequency response when the temporal change levels off and the frequency response immediately after immersion in the liquid. The cleanliness determination unit 752$c$ may calculate the mass of liquid insoluble contaminants based on the difference between the mass of contaminants deposited on the electrode and the mass of liquid soluble contaminants.

Figure 14:
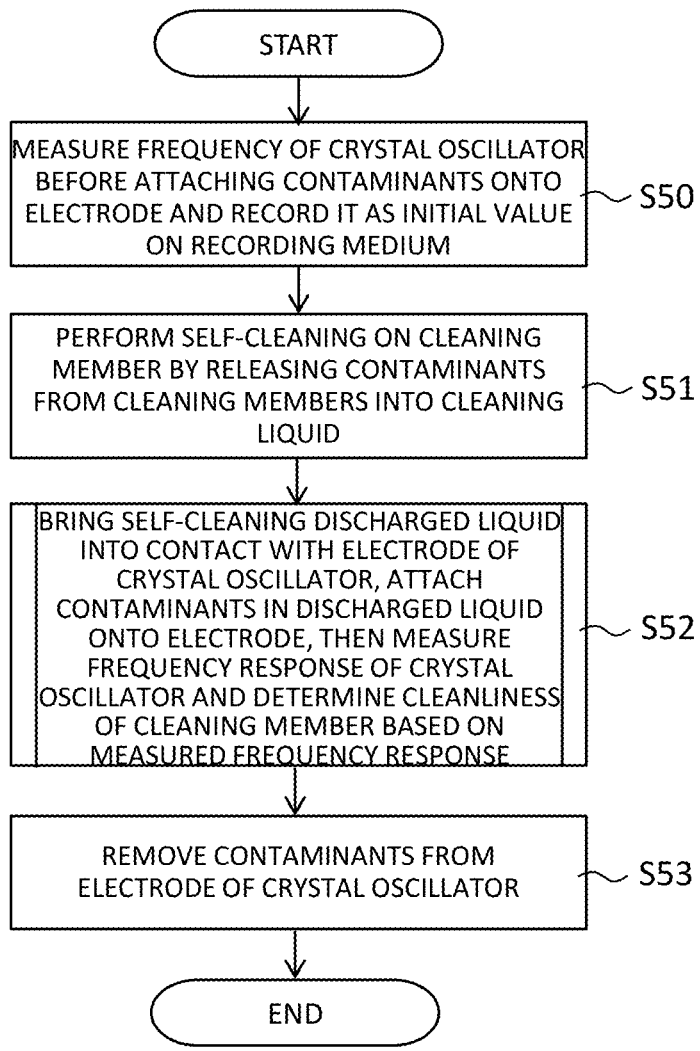
FIG. 14 is a flowchart illustrating a determination method according to the fifth embodiment.

Next, a determination method according to the fifth embodiment will be described. FIG. 14 is a flowchart illustrating a determination method according to the fifth embodiment.

As illustrated in FIG. 14, first, the initial value measurement unit 752$a$ measures the frequency of the crystal oscillator of the QCM sensor 50 before the contaminants are attached onto the electrode, and records the measured frequency as the initial value 753$a$ in the storage unit 753 (recording medium) (step S50).

Next, during the break-in process for the cleaning members 73 and 74 or after the scrub cleaning of the substrate W, the self-cleaning device 80 releases contaminants from the cleaning members 73 and 74 into the cleaning liquid for self-cleaning, thereby performing self-cleaning on the cleaning members 73 and 74 (step S51).

Next, after the discharged liquid of the self-cleaning device 80 is brought into contact with the electrode of the crystal oscillator of the QCM sensor 84, and the contaminants contained in the discharged liquid are attached onto the electrode of the crystal oscillator, the frequency response measurement unit 752$b$ measures the frequency response of the crystal oscillator in which contaminants are attached onto the electrode, and the cleanliness determination unit 752$c$ determines cleanliness of the cleaning members 73 and 74 based on the frequency response measured by the frequency response measurement unit 752$b$ (step S52).

Figure 15A:
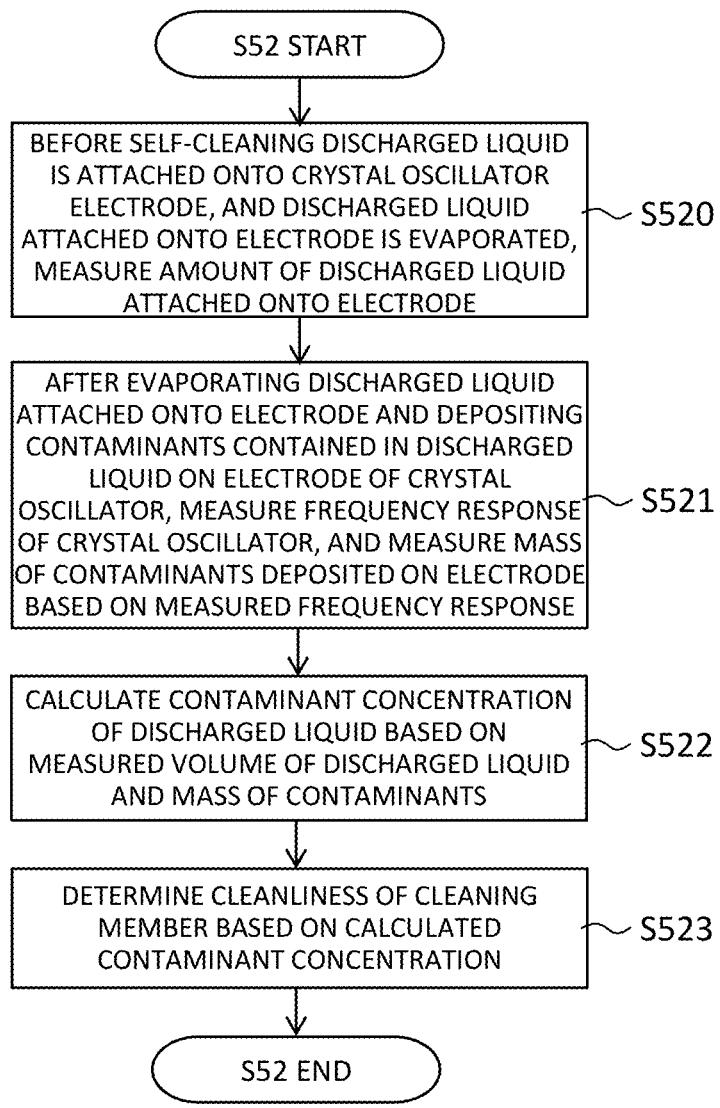
FIG. 15A is a flowchart illustrating a first example of the process of step S52.

As the first example of step S52, as shown in FIG. 15A, before the discharged liquid of the self-cleaning device 80 is attached onto the electrode of the crystal oscillator of the QCM sensor 84, and the discharged liquid attached onto the electrode is evaporated, the cleanliness determination unit 752$c$ may measure the amount (X) of the discharged liquid attached onto the electrode (step S520). In step S520, the frequency response measurement unit 752$b$ (a) may measure the frequency response of the crystal oscillator and the cleanliness determination unit 752$c$ may measure the amount of discharged liquid attached onto the electrode based on the measured frequency response, or the cleanliness determination unit 752$c$ (b) may measure the amount of contact liquid (X) with the measuring facility for the volume, the weight, or the contact time of the discharged liquid. Next, after the discharged liquid attached onto the electrode is evaporated to deposit contaminants contained in the discharged liquid on the electrode of the crystal oscillator, the frequency response measurement unit 752$b$ may measure the frequency response of the crystal oscillator, and the cleanliness determination unit 752$c$ may measure the mass of contaminants (Y) deposited on the electrode based on the measured frequency response (step S521). Then, the cleanliness determination unit 752c may calculate the contaminant concentration (Z=Y/X) of the discharged liquid based on the amount of liquid (X) and the mass of contaminants (Y) of the measured discharged liquid (step S522), and may determine cleanliness of the cleaning members 73 and 74 based on the calculated contaminant concentration (Z) (step S523).

Figure 15B:
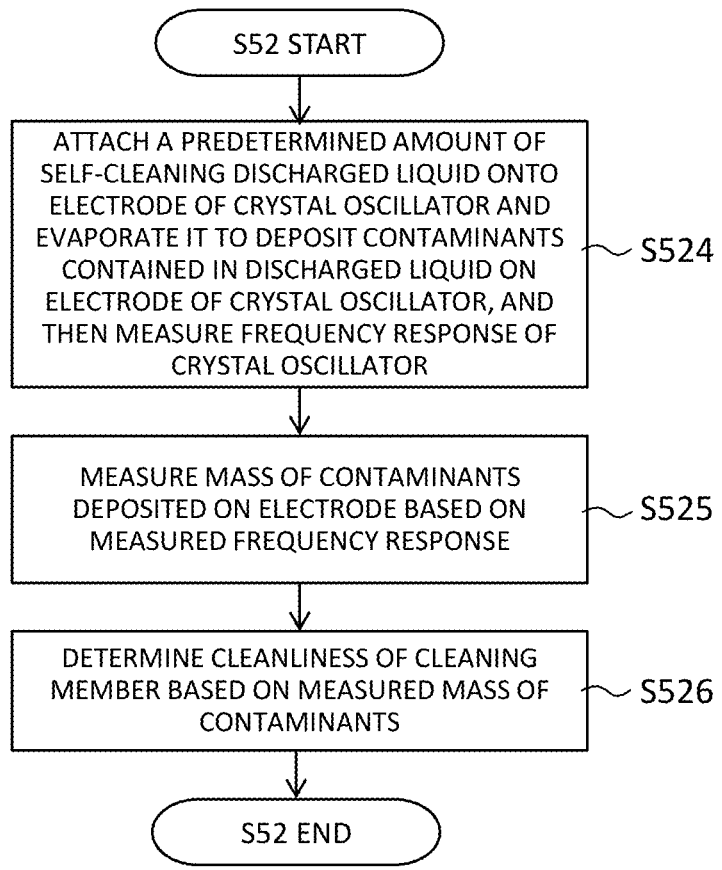
FIG. 15B is a flowchart illustrating a second example of the process of step S52.

As the second example of step S52, as shown in FIG. 15B, a predetermined amount of the discharged liquid of the self-cleaning device 80 is attached onto the electrode of the crystal oscillator of the QCM sensor 84 and evaporated, and the contaminants contained in the discharged liquid are deposited on the electrode of the crystal oscillator, and then the frequency response measurement unit 752b may measure the frequency response of the crystal oscillator (step S524). Next, cleanliness determination unit 752c may measure the mass of contaminants deposited on the electrode based on the measured frequency response (step S525), and determine cleanliness of the cleaning members 73 and 74 based on the measured mass of contaminants (step S526).

Figure 15C:
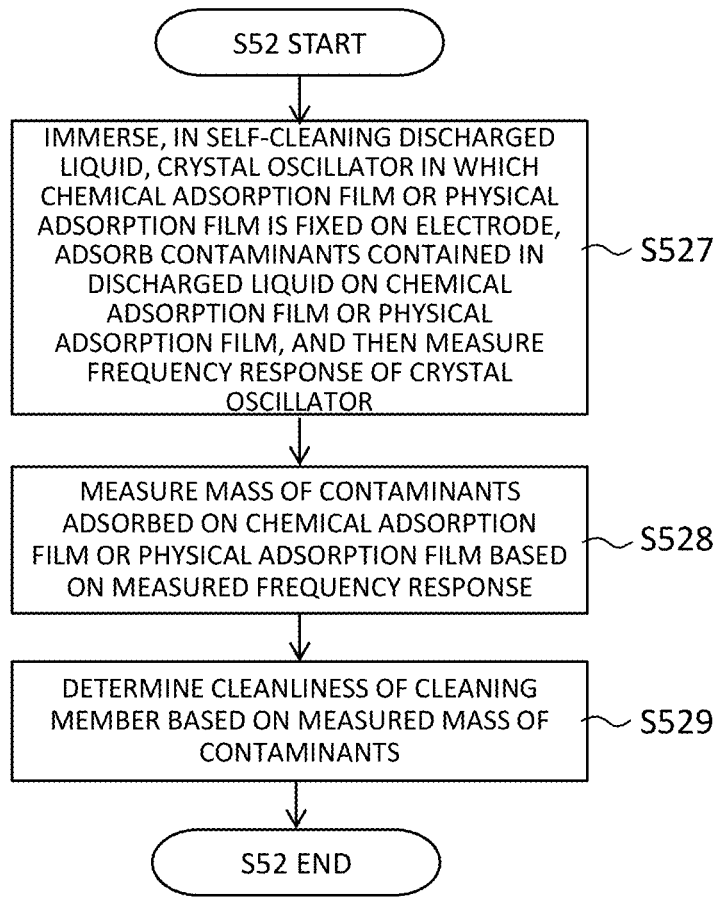
FIG. 15C is a flowchart illustrating a third example of the process of step S52.

As the third example of step S52, as shown in FIG. 15C, after a crystal oscillator in which an adsorption film that adsorbs contaminants by one or both actions of chemical adsorption and physical adsorption is fixed on the electrode is immersed in the discharged liquid of the self-cleaning device 80, and the contaminants contained in the discharged liquid are adsorbed on the adsorption film, the frequency response measurement unit 752b may measure the frequency response of the crystal oscillator (step S527). Next, the cleanliness determination unit 752c may measure the mass of contaminants adsorbed on the adsorption film based on the measured frequency response (step S528), and may determine cleanliness of the cleaning members 73 and 74 based on the measured mass of contaminants (step S529).

In the first example or the second example, after step S523 or S526, in a state where the crystal oscillator of the QCM sensor 50 in which contaminants are deposited on the electrode is immersed in the liquid (for example, pure water), the frequency response measurement unit 752b may measure the temporal change in the frequency response of the crystal oscillator, and the cleanliness determination unit 752c may measure the mass of liquid soluble contaminants based on the difference between the frequency response when the temporal change levels off and the frequency response immediately after immersion in the liquid. The cleanliness determination unit 752c may calculate the mass of liquid insoluble contaminants based on the difference between the mass of contaminants deposited on the electrode and the mass of liquid soluble contaminants.

Thereafter, as illustrated in FIG. 14, contaminants are removed (reset) from the electrode of the crystal oscillator of the QCM sensor 84, and preparation for the next measurement is performed (step S53). The method for removing the contaminants may be, for example, performed by water washing or chemical cleaning, or the contaminants may be evaporated by heating.

According to the present embodiment as described above, after the discharged liquid in the self-cleaning of the cleaning members 73 and 74 is brought into contact with the electrode of the crystal oscillator, and the contaminants contained in the discharged liquid are attached onto the electrode of the crystal oscillator, the frequency response of the crystal oscillator in which the contaminants are attached onto the electrode is measured, so that it is possible to detect even a very small mass of the contaminants, and cleanliness of the cleaning members 73 and 74 is determined based on the measurement result, so that it is less likely that cleaning members 73 and 74 with the residual contaminants will be mistakenly determined to be "clean", that is, it is possible to accurately determine cleanliness of the cleaning members 73 and 74.

Further, according to the present embodiment, after bringing the self-cleaning discharged liquid into contact with the electrode of the crystal oscillator, and attaching contaminants contained in the discharged liquid onto the electrode of the crystal oscillator, the frequency response of the crystal oscillator in which the contaminants are attached onto the electrode is measure while the crystal oscillator is disposed in the housing 71 where scrub cleaning is performed on the substrate W, so that it is possible to quickly determine cleanliness of the cleaning members 73 and 74 in-line, and it is possible to check the change in cleanliness over time, and predict the deterioration and replacement time of the cleaning members 73 and 74 based on the check.

Although the present embodiments and the modifications have been described above by way of example, the scope of the present technology is not limited thereto, and can be changed and modified according to the purpose within the scope described in the claims. For example, the method for evaluating the degree of contamination of a cleaning member according to as embodiment can be applied to an improved break-in process and an improved pre-shipment inspection of a cleaning member. In addition, the present embodiments and the modifications can be appropriately combined within a range in which the processing contents do not contradict each other.

In addition, although the determination device 10 according to the present embodiment can be configured by one or a plurality of computers, a program for causing one or a plurality of computers to realize the determination device 10 and a recording medium in which the program is non-transitorily recorded are also the protection target of the present invention.

What is claimed is:

1. A method for determining cleanliness of a cleaning member that contacts a substrate and with which scrub cleaning is performed, the method comprising:
    a first step of self-cleaning a cleaning member by releasing contaminants from the cleaning member into a cleaning liquid; and
    a second step of bringing a self-cleaning discharged liquid into contact with an electrode of a crystal oscillator, attaching the contaminants contained in the discharged liquid onto the electrode of the crystal oscillator by evaporating the discharged liquid, then measuring a frequency response of the crystal oscillator in which the contaminants are attached onto the electrode, and
    determining cleanliness of the cleaning member based on the measured frequency response, wherein
    the second step includes, bringing the self-cleaning discharged liquid onto the electrode of the crystal oscillator, and before evaporating the discharged liquid on the electrode, (a) measuring a frequency response of the crystal oscillator and measuring an amount of the discharged liquid on the electrode based on the measured frequency response, or (b) measuring an amount of the discharged liquid on the electrode with a measuring facility for a volume, a weight or a contact time of the discharged liquid, then, after evaporating the discharged liquid on the electrode to deposit contaminants contained in the discharged liquid on the electrode of the crystal oscillator, and then measuring the frequency response of the crystal oscillator, measuring a mass of the contaminants deposited on the electrode based on the measured frequency response, calculating a contaminant concentration of the discharged liquid based on the measured amount of discharged liquid and the measured mass of the contaminants, wherein determining cleanliness of the cleaning member based on the measured frequency response includes determining cleanliness of the cleaning member based on the calculated contaminant concentration.

2. The method according to claim 1, wherein
the first step includes self-cleaning the cleaning member by releasing contaminants from the cleaning member into the cleaning liquid in a housing where scrub cleaning is performed on the substrate, and
the second step includes bringing the self-cleaning discharged liquid into contact with the electrode of the crystal oscillator in the housing, attaching the contaminants contained in the discharged liquid onto the electrode of the crystal oscillator, then measuring the frequency response of the crystal oscillator in which the contaminants are attached onto the electrode with the crystal oscillator disposed in the housing, and determining cleanliness of the cleaning member based on the measured frequency response.

3. The method according to claim 1, further comprising a third step of immersing, in a liquid, the crystal oscillator in which contaminants are deposited on the electrode, measuring a temporal change in a frequency response of the crystal oscillator, and measuring a mass of liquid soluble contaminants based on a difference between a frequency when the temporal change levels off and a frequency response immediately after immersion in the liquid.

4. The method according to claim 2, further comprising a step of calculating a mass of liquid insoluble contaminants based on a difference between a mass of contaminants deposited on the electrode and a mass of liquid soluble contaminants.

5. The method according to claim 3, wherein
the liquid is an aqueous solution containing pure water, ammonia water, or a cleaning liquid.

6. The method according to claim 1, wherein
the first step includes immersing the cleaning member in the cleaning liquid to release contaminants from the cleaning member into the cleaning liquid.

7. The method according to claim 1, wherein
the first step includes injecting the cleaning liquid toward a surface of the cleaning member to release contaminants from the cleaning member into the cleaning liquid.

8. The method according to claim 1, wherein
the first step includes flowing the cleaning liquid into the cleaning member, and flowing out the cleaning liquid from a surface of the cleaning member to release contaminants from the cleaning member into the cleaning liquid.

* * * * *